United States Patent
Nakayama et al.

(10) Patent No.: US 6,436,776 B2
(45) Date of Patent: Aug. 20, 2002

(54) PROCESS FOR FABRICATING A ALIGNED LDD TRANSISTOR

(75) Inventors: Takeo Nakayama, Chigasaki; Akira Hokazono, Sagamihara, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/820,658

(22) Filed: Mar. 30, 2001

Related U.S. Application Data

(62) Division of application No. 09/526,959, filed on Mar. 16, 2000, now abandoned.

(30) Foreign Application Priority Data

Mar. 16, 1999  (JP) ............................................. 11-069897
Mar. 19, 1999  (JP) ............................................. 11-076355

(51) Int. Cl.[7] ........................................... H01L 21/336
(52) U.S. Cl. ...................................... 438/305; 438/595
(58) Field of Search ........................ 438/265, 299–301, 438/303, 305, 307, 592, 595, 652, 655–660, 682–684

(56) References Cited

U.S. PATENT DOCUMENTS

| | | | |
|---|---|---|---|
| 4,855,247 A | * 8/1989 | Ma et al. | 438/305 |
| 4,890,141 A | 12/1989 | Tang et al. | 257/384 |
| 5,162,884 A | 11/1992 | Liou et al. | 257/384 |
| 5,168,072 A | 12/1992 | Moslehi | 257/327 |
| 5,397,909 A | 3/1995 | Moslehi | |
| 5,648,673 A | 7/1997 | Yasuda | 257/382 |

OTHER PUBLICATIONS

Goto et al., "A High Performance 50 nm PMOSFET using Decaborane (B10H14) Ion Implantation and 2–step Activation Annealing Process", IEEE 1997 (IEDM 97), pp. 471–474.*

* cited by examiner

Primary Examiner—Howard Weiss
Assistant Examiner—Marcos D. Pizarro-Crespo
(74) Attorney, Agent, or Firm—Pillsbury Winthrop LLP

(57) ABSTRACT

A shallow impurity diffusion layer adjacent to a gate electrode is formed by forming a side-wall insulating film of the gate electrode twice, and a MOS transistor of the salicide type having improved short-channel effect is embodied. An impurity diffusion layer portion not adjacent to a gate electrode of a source/drain region is formed first by self-alignment with a first side-wall insulating film. After an impurity diffusion layer adjacent to the gate electrode is formed by self-alignment with the gate electrode, a second side-wall insulating film is formed. Silicide films are formed on the gate electrode and source/drain region by self-alignment with the second side-wall insulating film.

16 Claims, 15 Drawing Sheets

PROCESS FOR FABRICATING A ALIGNED LDD TRANSISTOR

This is a division of application Ser. No. 09/526,959, filed Mar. 16, 2000 now abandoned.

CROSS-REFERENCE TO RELATED APPLICATIONS

This application is based upon and claims the benefit of priority from the prior Japanese Patent Applications No. 11-069897, filed Mar. 16, 1999; and No. 11-076355, Mar. 19, 1999, the entire contents of which are incorporated herein by reference.

BACKGROUND OF THE INVENTION

The present invention relates to a method of manufacturing a MOS-type transistor or a MIS-type transistor and to a MOS-type transistor or a MIS-type transistor. More specifically, it relates to the method of forming a diffusion layer in the salicide process and to a MOS-type transistor or a MIS-type transistor which will be obtained by this method.

As a result of an increasing demand in recent years for speeding-up as well as for the realization of high performance, the formation of low-resistance refractory metal silicide film, such as $TiSi_2$ and $CoSi_2$, on the gate electrode and on the source-drain diffusion layer by self-alignment with the gate electrode is now being practiced. This is called the salicide structure. On the other hand there is a strong demand for miniaturization which makes it indispensable to form a diffusion area thinly on the semiconductor substrate.

Conventionally the salicide structure has been manufactured as follows. First form a polycrystal silicon layer on a silicon substrate 1 through a gate insulating film 2, and form a gate electrode 3 by patterning it (FIG. 1A). Then form a shallow impurity diffusion layer 4 by the ion-implantation of impurity by using the gate electrode 3 as a mask (FIG. 1B).

Next, form a silicon nitride film on the entire surface of a substrate, and form a side-wall insulating film 5 on the side walls of a gate electrode 3 by implementing anisotropic etching, such as reactive ion etching (RIE). Then form a deep impurity diffusion layer 6 by the ion-implantation of impurity by using the side-wall insulating film 5 as a mask, and at the same time introduce impurity into the gate electrode 3 (FIG. 1D)

After this, heat the entire structure to activate the impurity in the gate electrodes 3 and also the impurity in the impurity diffusion layers 4 and 6 at the same time. This process forms a shallow diffusion layer 7, adjacent to the gate electrode, having the so-called extension structure with a high-impurity concentration (FIG. 1E).

As the condition for activating the impurity, however, it is necessary to activate the impurity in the polycrystal silicon, which is the gate electrode, as well as the impurity in the deep impurity diffusion layer 6, all at the same time. Therefore, high temperature is required for this process, thus diffusing the shallow impurity diffusion layer 4 to a comparatively deep depth and making it difficult to maintain the shallow impurity diffusion layer at the shallow depth.

Next, form a silicide film 8 on the upper side of the gate electrode 3 and on the exposed surface of the impurity diffusion layer 7 (FIG. 1F).

As described above, the conventional technology has formed the shallow impurity diffusion layer 4 before the deep impurity diffusion layer 6 is formed, thus diffusing the impurity of the shallow impurity diffusion layer 4 to a deep depth and making it difficult to form the aimed shallow impurity diffusion layer.

In order to solve this problem, it is proposed to use the method of forming a deep impurity diffusion layer first after forming a gate side-wall insulating layer and then forming a shallow impurity diffusion layer after removing the side-wall insulating film (Ref. Kenichi Goto et al. "A High Performance 50 nm PMOSFET using Decaborane ($B_{10}H_{14}$) Ion Implantation and 2-step Activation Annealing Process" IEDM-97, pp. 471–474). However, this technology does not provide the gate side-wall insulating film, and therefore forms a silicide film on the side wall of the gate electrode when trying to provide a low resistance silicide film on the upper side of the gate and on the upper side of the impurity diffusion layer, resulting in a short circuit formed between the gate electrode and the impurity diffusion layer. Accordingly this structure cannot be applied to the silicide process.

Further, in this method, the side-wall insulating layer is removed by isotropic etching without covering the gate insulating film, so that an exposed portion of the gate insulating film is slightly etched. This makes the life of the gate insulating film shorter, or, at worst, a failure occurs in the gate insulating film.

BRIEF SUMMARY OF THE INVENTION

The objects of this invention are to form a shallow impurity diffusion layer adjacent to a gate electrode, to provide the method of manufacturing a MOS transistor or a MIS transistor of the silicide type improved in the short channel effect, and to provide the composition of a semiconductor device which is made possible by this method.

In order to achieve the foregoing objects, a manufacturing method of a semiconductor device, which is a first aspect of the present invention, comprising the steps of:

forming a gate electrode on a semiconductor substrate through a gate insulating film;

forming a protective insulating film on a side-wall of the gate electrode;

forming a first side-wall insulating film on the protective insulating film formed on the side-wall of the gate electrode;

forming a first impurity diffusion layer on a surface of the semiconductor substrate by using the gate electrode and the first side-wall insulating film as a mask;

removing the first side-wall insulating film after the step of forming the first impurity diffusion layer;

forming a second impurity diffusion layer on the surface of the semiconductor substrate by using the gate electrode and the protective insulating film as a mask after the step of removing the first side-wall insulating film;

forming a second side-wall insulating film on the protective insulating film formed on the side-wall of the gate electrode after the step of forming the second impurity diffusion layer; and forming a conductive film on an upper surface of the gate electrode and on a surface of the second impurity diffusion layer by using the second side-wall insulating film as a mask.

It is desirable that the step of forming the conductive film includes the step of forming a conductive film having a resistance lower than that of the second impurity diffusion layer.

It is desirable that a thickness of the first side-wall insulating film differs from that of the second side-wall insulating film.

It is desirable that a thickness of the first side-wall insulating film is smaller than that of the second side-wall insulating film.

Material of the first side-wall insulating film can be differentiated from that of the second side-wall insulating film.

It is desirable that the material of the first side-wall insulating film is $SiO_2$ and that the second side-wall insulating film is composed of SiN.

It is desirable that the step of forming the first impurity diffusion layer and the step of forming the second impurity diffusion layer include the step of introducing and activating an impurity and a temperature of a heat treatment for activating the impurity of the first impurity diffusion layer is higher than that of the second impurity diffusion layer.

It is desirable that a diffusion distance of an impurity of the first impurity diffusion layer is longer than that of the second impurity diffusion layer.

It is desirable that the step of forming the first or second side-wall insulating film includes the step of forming a silicon oxide film and a silicon nitride film laminated thereon, and that the step of forming a conductive film on an upper surface of the gate electrode and on a surface of the first or second impurity diffusion layer includes the step of performing selective growth of silicon under a supply limited condition, and the step of performing selective growth of silicon under a reaction limited condition, after the step of performing selective growth of silicon under a supply limited condition.

It is also desirable to provide the step of etching back the silicon oxide film underneath the silicon nitride film, before the step of forming a conductive film on an upper surface of the gate electrode and on a surface of the first or second impurity diffusion layer.

It is desirable that the step of performing selective growth of silicon under a supply limited condition includes the step of performing the selective growth up to an extent where silicon-growing film becomes thicker than a film thickness of the silicon oxide film underneath the nitride film.

It is desirable to further comprise the step of removing by etching silicon particles formed on the semiconductor substrate including the side-wall insulating film, after the step of performing selective growth of silicon under a supply limited condition.

It is desirable that the gate electrode is formed of polycrystal silicon and the step of forming a first impurity diffusion layer includes the step of performing simultaneously introduction of impurity into the gate electrode and activation of the impurity.

It is desirable that the semiconductor substrate is composed of silicon and the conductive film is mainly formed of a refractory metal and silicon.

The semiconductor device, which is a second aspect of the present invention, comprising:

a semiconductor substrate;

a gate electrode formed through a gate insulating film on the semiconductor substrate;

a side-wall insulating film formed on a side of the gate electrode;

a first impurity diffusion layer formed with a first depth on a surface of the semiconductor substrate underneath the side-wall insulating film on the side of the gate electrode;

a second impurity diffusion layer formed with a second depth on the surface of the semiconductor substrate adjacent to and connected to the first impurity diffusion layer, the second depth being deeper than the first depth; and a first conductive layer formed on a surface of the second impurity diffusion layer with an end closest to the gate electrode in contact with the outermost portion of a surface of the side-wall insulating film and formed to have a resistance lower than that of the second diffusion impurity layer; and wherein the shortest distance between the end of the conductive layer and an end of the second impurity diffusion layer on the side of the gate electrode is greater than a distance between a bottom of the conductive layer and a bottom of the second impurity diffusion layer.

The gate electrode is desirably composed of polycrystal silicon, and has a second conductive film formed on an upper surface thereof, the second conductive film having a resistance lower than that of the gate electrode.

It is desirable that the side-wall insulating film is composed of SiN.

It is desirable that the first conductive film include a refractory metal and Si and that the refractory metal is Ti.

In the present invention, the side-wall insulating film of the gate electrode is formed twice. For this reason, it becomes possible to change the material of the side wall and the width (thickness) of a side-wall insulating film at the first time and at the second time. This makes it possible to use at the first time a side-wall insulating film suitable for enhancing the performance of a transistor and to use at the second time a side-wall insulating film of the width and material suitable for making the salicide structure for forming a silicide film on to the gate electrode and the source/drain region.

Also by forming the side-wall of a gate electrode twice, it becomes possible to embody the salicide structure for forming a silicide film on to the gate electrode and the source-drain region after forming first the portion of the impurity diffusion layer not adjacent to the gate electrode in the source-drain region and later the impurity diffusion layer adjacent to the gate electrode.

Furthermore, this makes it possible to carry out first the heat treatment required for activating the impurity diffusion layer not adjacent to the gate electrode of a transistor as well as impurity in the gate electrode, and thus to form a shallow impurity diffusion layer adjacent to the gate electrode. This brings about improvement of the short channel effect which prevents the miniaturization of a transistor, and is effective for the embodiment of further miniaturized transistor.

Also, when forming silicon as a conductive film on a secondary impurity diffusion layer, facets are not formed near the gate electrode because the initial growth is done under the supply limited condition which is changed to the reaction limited condition after it has reached the side-wall nitride film in the direction of thickness.

Further, because the initial silicon growth is done under the supply limited condition, a flat film not dependent on the crystallinity of underlying silicon is obtained. There is also an advantage that cavity is not formed underneath the nitride silicon side-wall.

The above-mentioned manufacturing method also makes it possible for the initial growth to proceed under the supply limited condition up to the extent where it does not reach the side-wall nitride film by placing a proper amount of side-etching in the oxide film underneath the side-wall nitride film prior to the selective epitaxial growth. This makes it possible to reduce the amount of side-etching to be placed underneath the nitride silicon side wall and thus to widen the margin for dilute hydrofluoric acid treatment which is the pretreatment of the epitaxial growth. Also the adoption of the elevated source-drain structure process makes it possible to easily form a silicon film which is not dependent on the underlying silicon without forming facets near the gate electrode, by combining the supply limited condition and the reaction limited condition in the selective growth process of silicon which has been carried out conventionally only either under the supply limited condition or under the reaction limited condition.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings.

(First Embodiment)

Figure 1A:
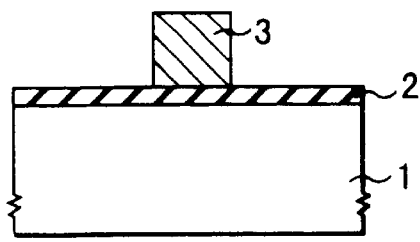
FIGS. 1A to 1F are sectional views illustrating in steps the method of manufacturing a MOS device of the conventional salicide structure.
Figure 1B:
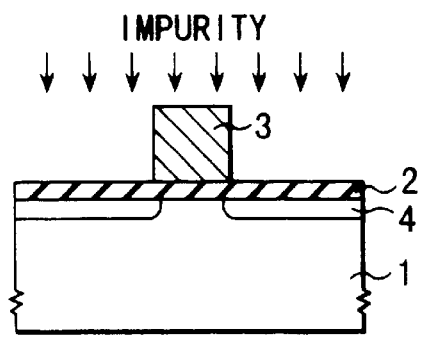
Figure 1C:
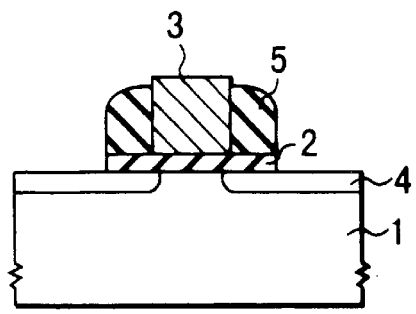
Figure 1D:
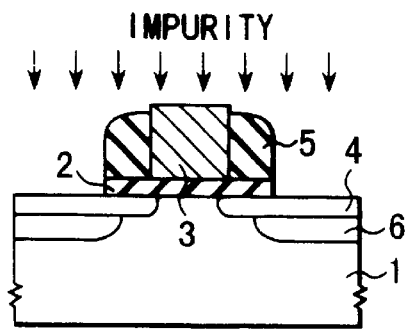
Figure 1E:
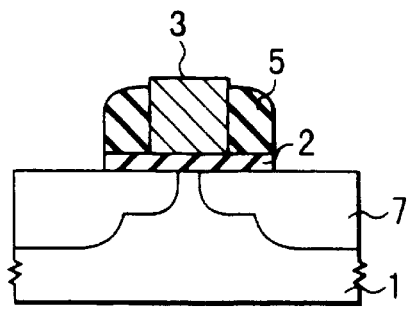
Figure 1F:
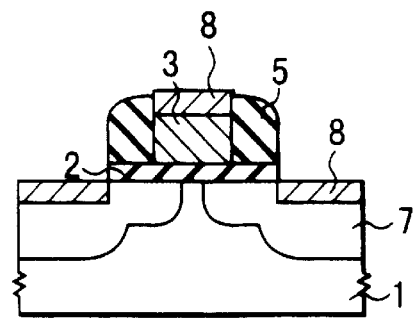
Figure 2A:
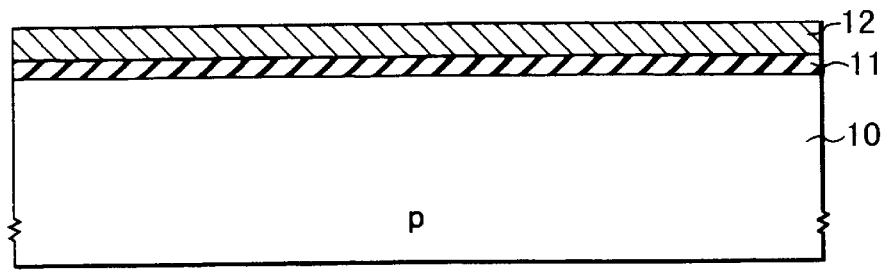
FIGS. 2A to 2T are sectional views illustrating in steps the method of manufacturing a MOS device according to the first and second embodiments of the present invention.
Figure 2B:
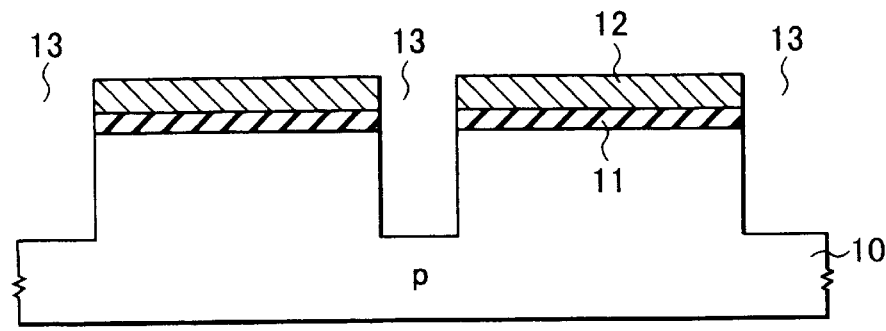
Figure 2C:
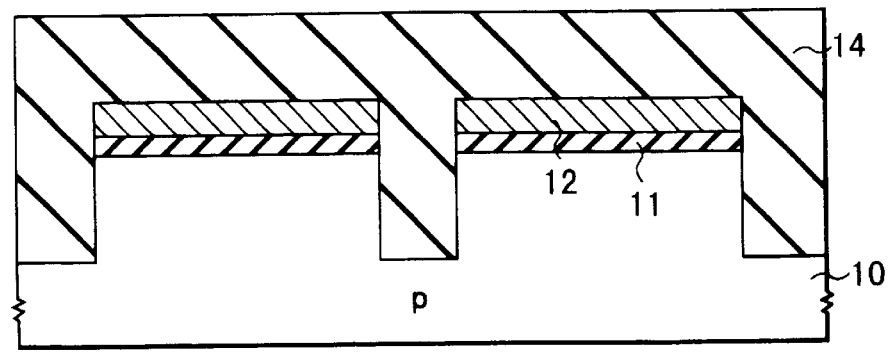
Figure 2D:
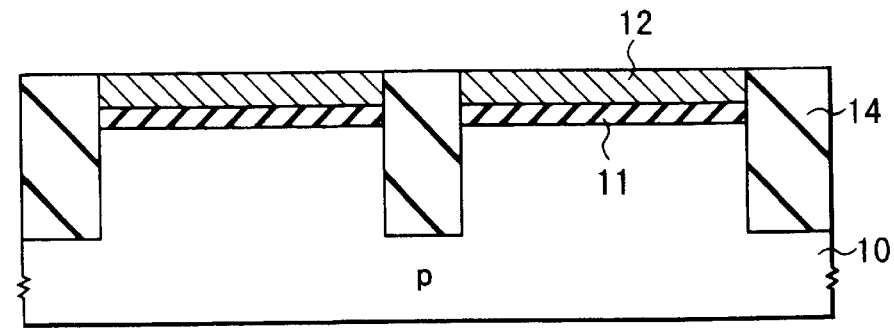
Figure 2E:
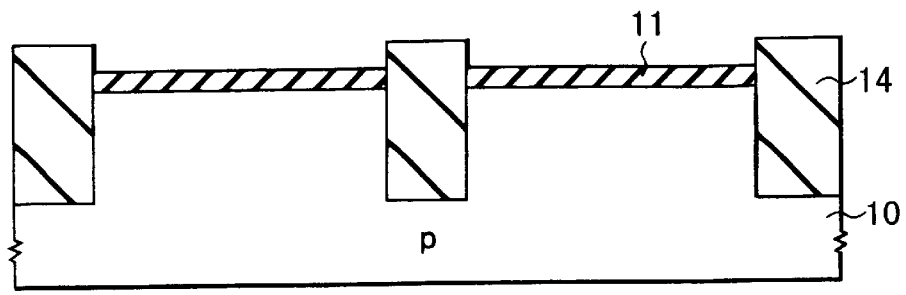
Figure 2F:
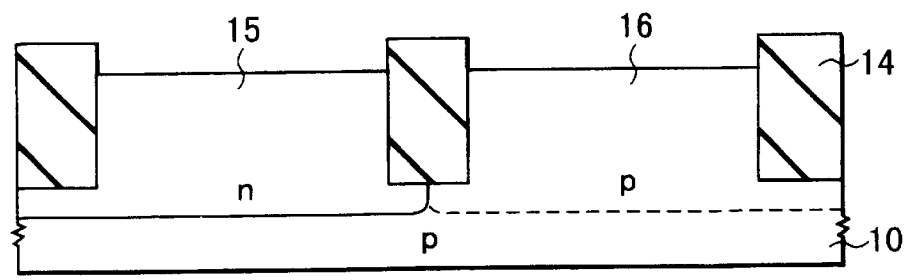
Figure 2G:
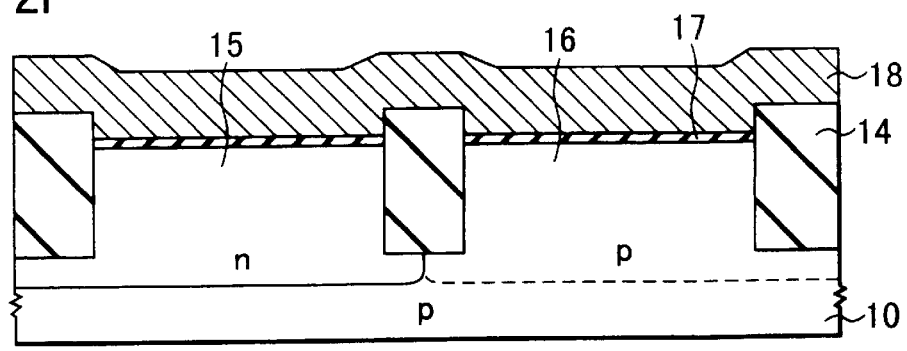
Figure 2H:
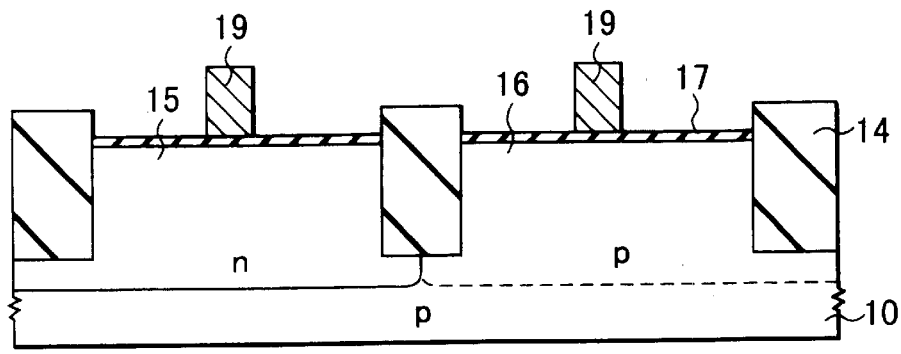
Figure 2I:
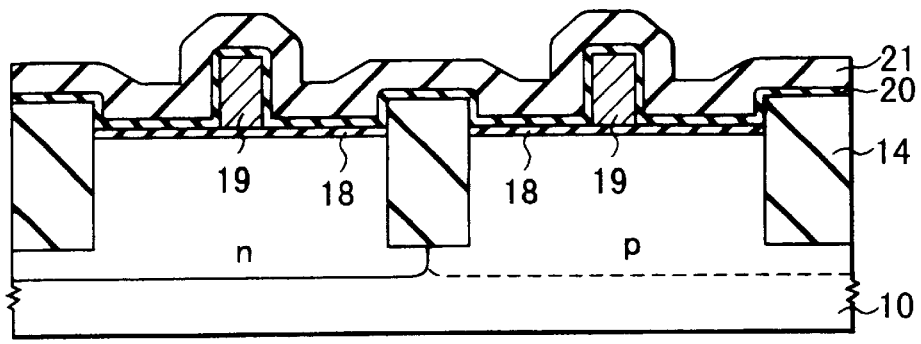
Figure 2J:
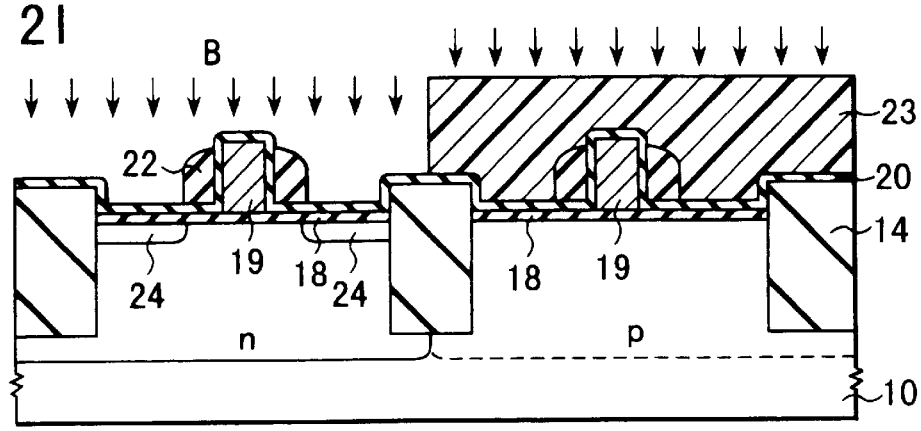
Figure 2K:
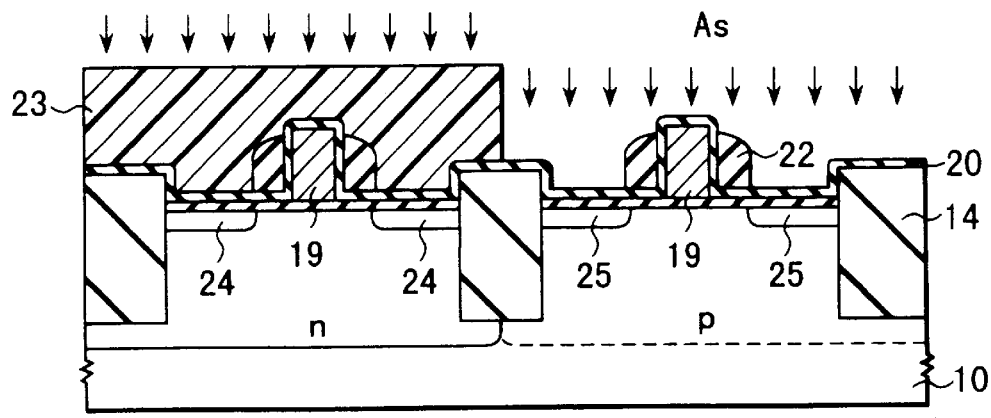
Figure 2L:
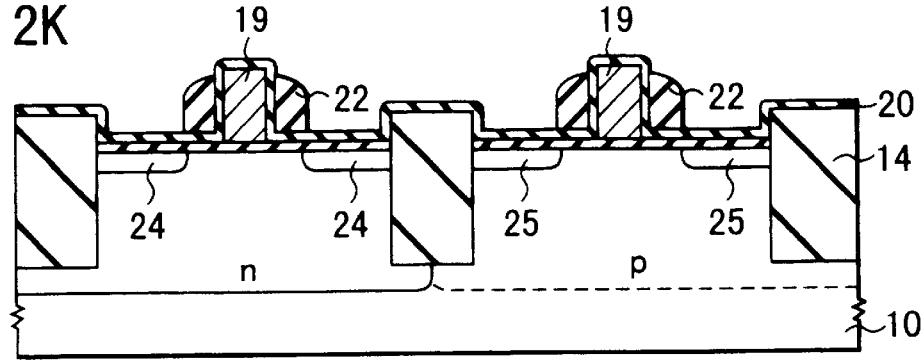
Figure 2M:
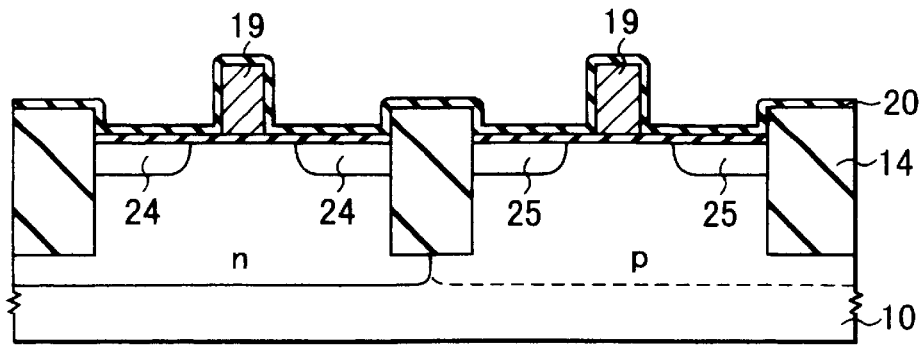
Figure 2N:
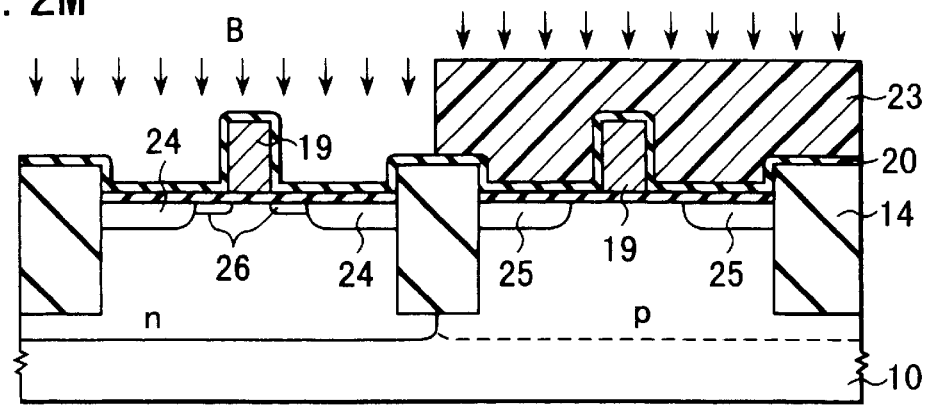
Figure 2O:
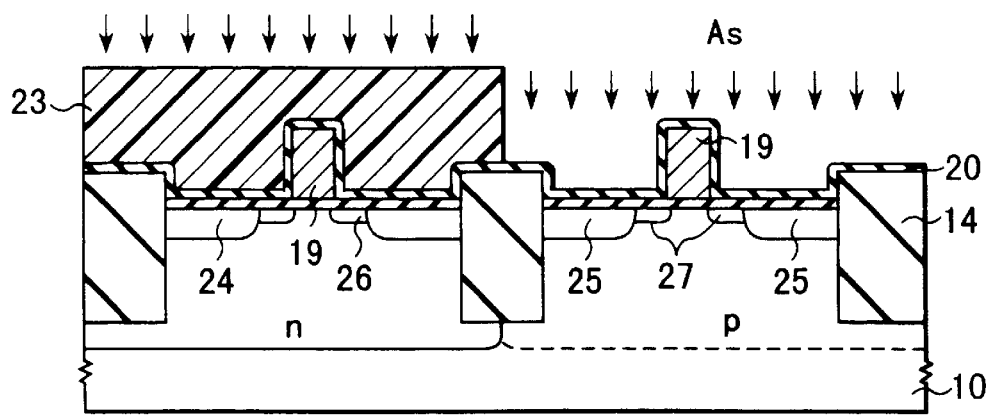
Figure 2P:
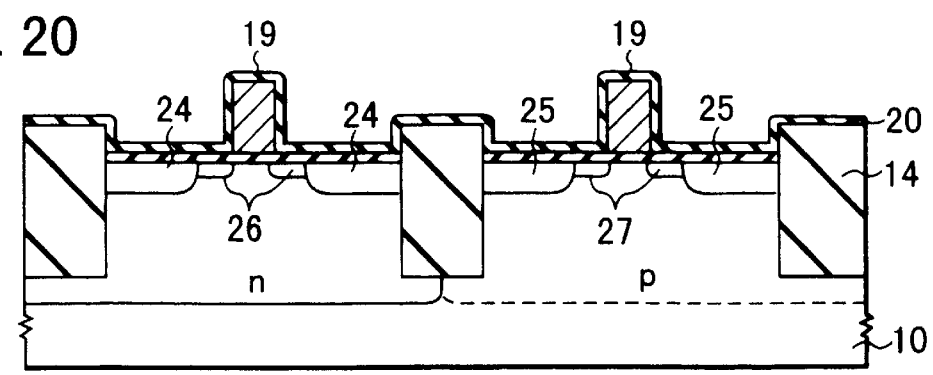
Figure 2Q:
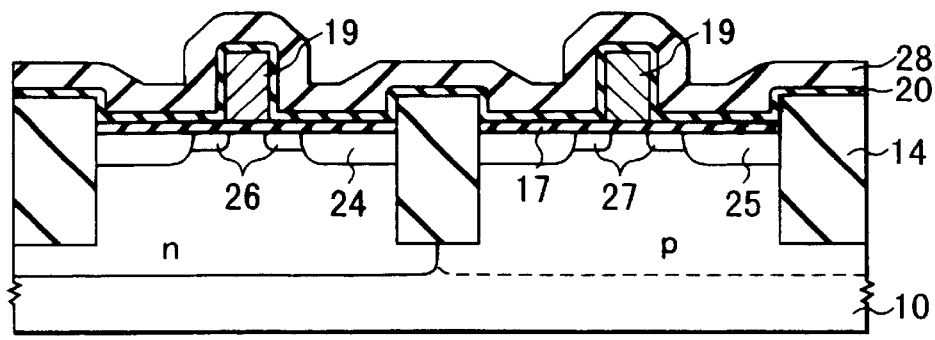
Figure 2R:
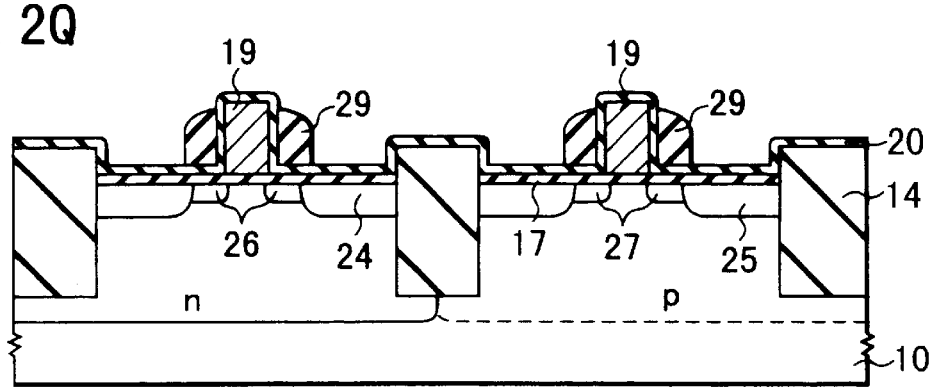
Figure 2S:
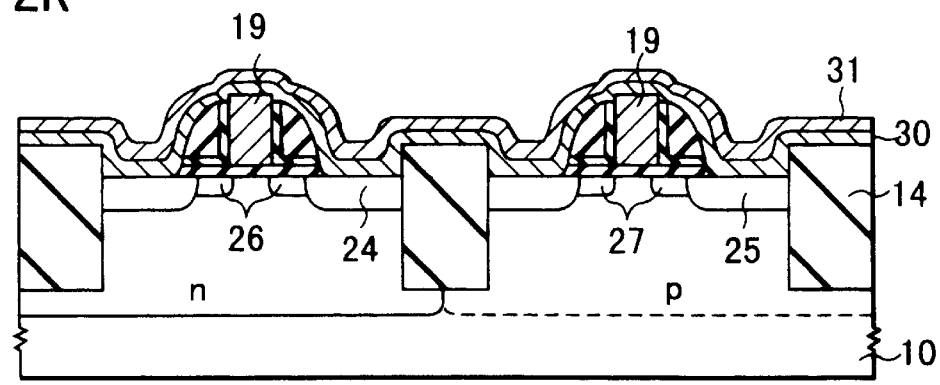
Figure 2T:
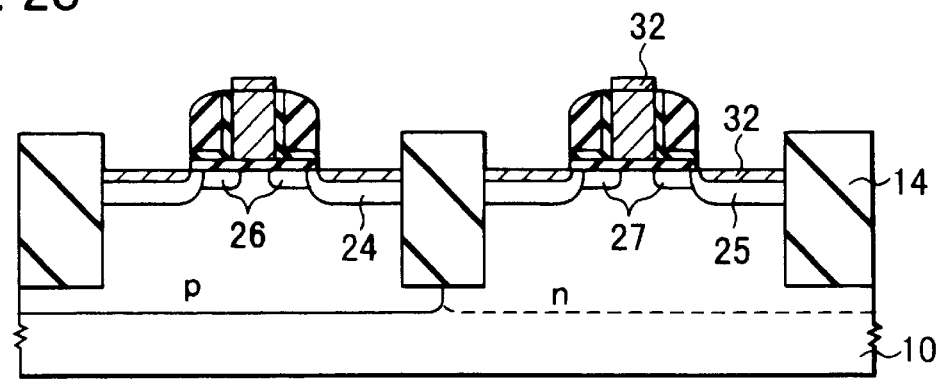

FIGS. 2A to 2T are partial sectional views illustrating in steps the method of manufacturing a semiconductor device according to a first embodiment of the present invention. The manufacturing method will be described according to these drawings.

First, form the $SiO_2$ film 11 having the thickness of 50 nm on the p-type silicon single-crystal substrate 10 by the hydrogen burning oxidation method at 950° C., and further deposit the SiN film 12 by 300 nm by the chemical vapor deposition method on it (FIG. 2A).

Next, remove partly the SiN film, $SiO_2$ film, and the silicon substrate by the lithography technology and the anisotropic reactive ion-etching method (hereinafter to be referred to as the RIE method) (FIG. 2B). After that, deposit the $SiO_2$ film 14 which will be used for element isolation (FIG. 2C).

Next, sharpen the surface uniformly by the chemical mechanical polishing technology (hereinafter to be referred to as the CMP technology) and expose the surface of the SiN film 12 (FIG. 2D). At this time, give selectivity for CPM between the $SiO_2$ film 14 and the SiN film 12.

Next, remove the remaining SiN film 12 by the chemical vapor etching technology (FIG. 2E). Further, remove the $SiO_2$ film 11 with the $NH_4F$ (ammonium fluoride) solution.

Next, form a well region 15 of the conductivity type (n type in this case), which is contrary of the silicon substrate 10, and a well region 16 of the same conductivity type (p type), by using the lithography technology and the ion-implantation technology. (FIG. 2F)

Next, form a 6 nm thick $SiO_2$ film 17 on the silicon substrate 10 by the dry oxygen oxidation method, and deposit by the chemical vapor deposition method a 200 nm thick polycrystal silicon film 18, which will be used for the gate electrode (FIG. 2G).

Next, form a gate electrode 19 by removing the polycrystal silicon film in parts other than the gate electrode portions by the lithography technology and the RIE technology (FIG. 2H).

Next, deposit the $SiO_2$ film 20 by 20 nm and SiN by 100 nm as a first insulation film 21 (FIG. 2I). Next, leave the first insulation film 21 only on the side wall of the gate electrode by using the RIE technology to form a side-wall insulating film 22. After that, form the impurity diffusion layer 24 (source/drain region) by covering unnecessary parts with the resist 23 and inducing boron into the silicon substrate with the acceleration voltage of 10 kev and the dose of $4 \times 10^{15}$ $cm^{-2}$. At this time, boron is introduced also into the gate electrode 19 (FIG. 2J).

Next, cover unnecessary parts with resist 23 by the lithography technology, and introduce arsenic (As) into the silicon substrate 10 by the ion-implantation technology with the acceleration voltage of 60 keV and the dose of $5 \times 10^{15}$ $cm^{-2}$. By this process the impurity diffusion layer 25 (source/drain region) is formed, and arsenic is also introduce into the gate electrode 19 which has been exposed at that time (FIG. 2K). Following this process, remove resist 23 and give a heat treatment at 1015° C. for 15 seconds to activate the impurity introduced (FIG. 2L).

Next, remove the gate side-wall insulation film 22 by the chemical vapor etching technology (FIG. 2M). Next, cover unnecessary parts with resist 23 by the lithography technology, and form a shallow impurity diffusion layer 26 by introducing boron (B) into the silicon substrate 10 by the ion-implantation technology with the acceleration voltage of 5 keV and the dose of $1 \times 10^{14}$ $cm^{-2}$ (FIG. 2N).

Next, cover unnecessary parts with resist 23 by the lithography technology, and form a shallow impurity diffusion layer 27 by introducing arsenic (As) into the silicon substrate 10 by the ion-implantation technology with the acceleration voltage of 15 kev and the dose of $1\times10^{14}$ cm$^{-2}$ (FIG. 2O). Following this process, after removing the resist 23, give a heat treatment at 900° C. for 30 seconds to activate the introduced impurity (FIG. 2P).

Next, deposit an SiN film by 100 nm as a secondary insulating film 28 over the entire surface of the substrate (FIG. 2Q). After that, leave the secondary insulating film 28 only on the side wall of the gate electrode 19 by the RIE technology to form a secondary gate side-wall insulating film 29 (FIG. 2R).

Next, after removing the silicon oxide films 20 and 17 exposed on the surface of the substrate, form a Ti film 30 with the film thickness of 30 nm and a TiN film 31 with the film thickness of 15 nm by sputtering technology. (FIG. 2S)

Following this process, give a heat treatment at 675° C. for 30 seconds to cause Si to react with Ti of the Ti film on the surface of the source/drain layer and on the upper side of the gate electrode. After this process, remove unnecessary (unreacted) Ti film 30 and TiN film 31 with a mixed solution of sulfuric acid and peroxide. Further, in order to lower resistance of TiSi$_x$ film, give a heat treatment at 850° C. for 30 seconds. This process forms a TiSi$_x$ film 32 selectively on the upper side of the gate electrode and on the surface of source/drain region. (FIG. 2T).

Following this process, by using the common technology, form a layer insulation film, flatten it, and further form interconnections of the metal interconnection film (such as Al—Si—Cu alloy) by opening a contact hole.

As described above, it is possible to form a transistor of the salicide structure, which has a shallow diffusion layer with a high impurity concentration, adjacent to the gate electrode.

(Second Embodiment)

In the first embodiment, the explanation was given about the case where a primary side-wall insulating film and a secondary side-wall insulating film have the same material and thickness. However, it is possible to differ the material and thickness of the primary and secondary side-wall insulating films, and thus it is also possible to make the structure of a transistor which can suppress cementing leaks than before. The second embodiment is such an example.

The basic process of the second embodiment is the same as that of the first embodiment, and therefore reference will be made to FIGS. 2A to 2T which were used to describe the first embodiment. If the process is exactly the same as that of the first embodiment, duplication of the description will be omitted.

The processes of FIGS. 2A to 2H are implemented as done in the first embodiment. Following these processes, deposit a SiO$_2$ film 20 by 20 nm and polycrystal silicon by 100 nm as a primary insulating film 21 (FIG. 2I). Following this process, form a primary side-wall insulating film 22 by leaving the primary insulating film 21 only on the side wall of the gate electrode. The succeeding process of FIGS. 2J to 2P are implemented exactly in the same manner as in the first embodiment. Next, deposit a SiN film by 150 nm as a secondary insulating film 28 over the entire surface of the substrate (FIG. 2Q). Following this process, form a secondary gate side-wall insulating film 29 by leaving the secondary insulating film 28 only on the side wall of the gate electrode 19 by the RIE technology (FIG. 2R). The processes including and following FIG. 2S will be implemented exactly in the same manner as in the first embodiment.

In the second embodiment, polycrystal silicon was used as the primary insulating film 21. It has an advantage that it is easy to apply etching in comparison with SiN. However, polycrystal silicon has a disadvantage that it is likely to react with Ti. Therefore, SiN is preferred as a secondary insulating film 28. Although SiO$_2$ is a little lacking in terms of reaction with Ti, it is possible to use SiO$_2$ as a secondary insulating film 28.

Figure 3:
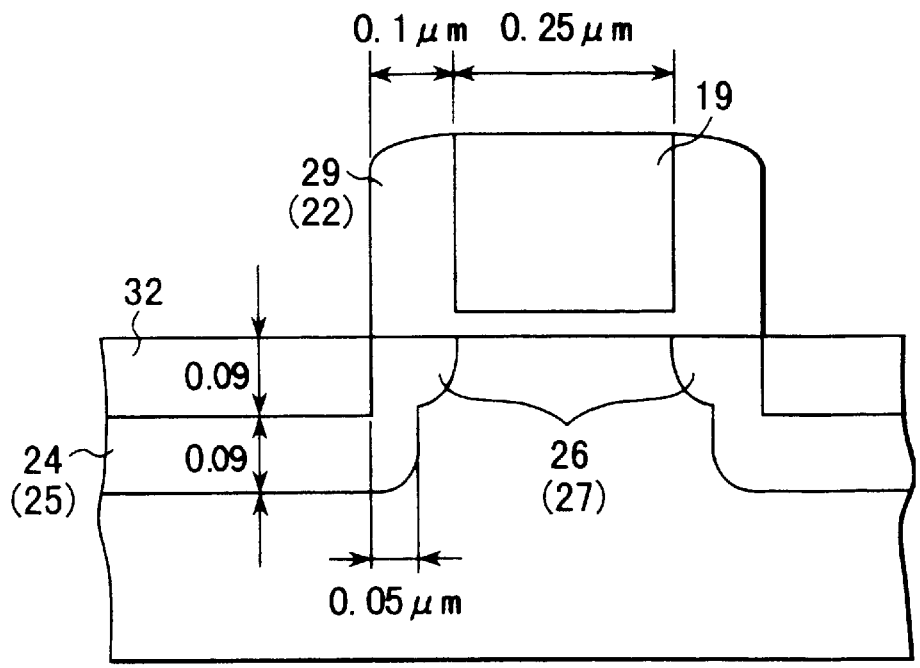
FIG. 3 is a sectional view illustrating the dimension of major parts of a MOS device according to a first embodiment of the present invention.
Figure 4:
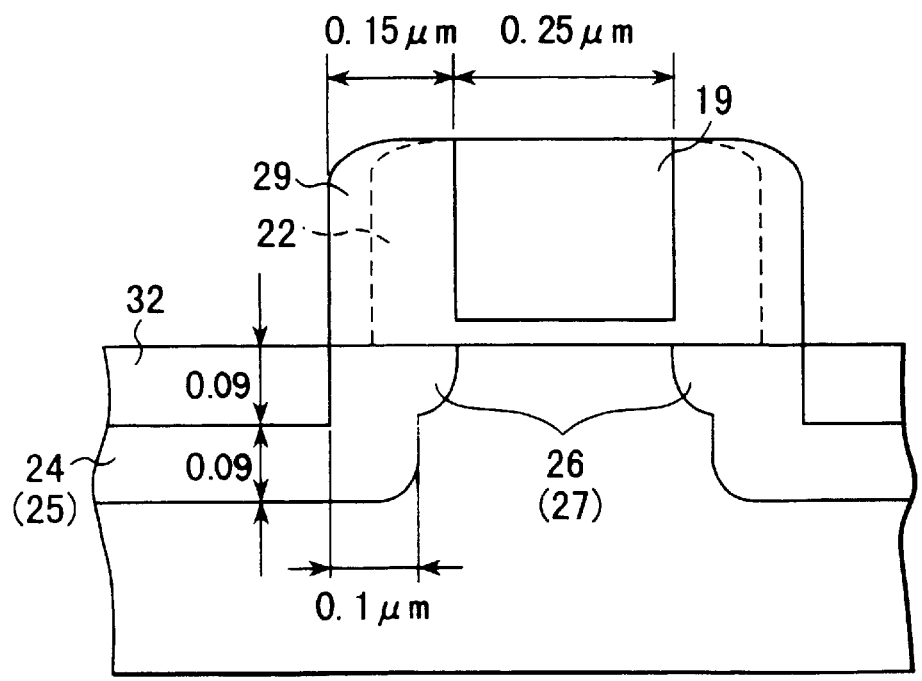
FIG. 4 is a sectional view illustrating the dimension of the major parts of a MOS device according to a second embodiment of the present invention.

At this point, the difference in the dimension of the transistors made in the first and second embodiments will be described. FIG. 3 illustrates the dimension of the transistor made in the first embodiment and FIG. 4 illustrates the dimension of the transistor made in the second embodiment respectively.

Assuming that the width of the gate electrode is 0.25 $\mu$m in either of the first and second embodiments, the deep impurity diffusion layer 24 (or 25) formed by using the primary side-wall insulating film 22 as a mask will have a depth of about 0.18 $\mu$m. The thickness of a silicide layer 32 formed by using the secondary side-wall insulating film as a mask will be about 0.09 $\mu$m. Accordingly the deep impurity diffusion layer left underneath the silicide layer 32 will have a depth (thickness) of 0.09 $\mu$m.

In the case of the first embodiment, when forming a deep impurity diffusion layer, the dimension of the impurity diffusion layer extending horizontally from one end thereof toward the side of the gate electrode is about 0.05 $\mu$m. After this process, a silicide layer 32 will be formed by using the secondary side-wall insulating film 29 as a mask. The distance from one end of this silicide layer 32 on the side of the gate electrode to the other end of a deep diffusion layer on the side of the gate electrode becomes 0.05 $\mu$m (FIG. 3).

In the case of the second embodiment, on the other hand, when forming a deep impurity diffusion layer, the horizontal dimension extending horizontally from the end of the primary side-wall insulating film 22 toward the side of the gate electrode is about 0.05 $\mu$m, but a silicide layer 32 is formed by alignment with the secondary side-wall insulating film 29 (the thickness or width is 150 nm). As a result of this process, the distance from the end of the silcide layer 32 on the side of the gate electrode to the end of the deep impurity diffusion layer 24 (or 25) on the side of gate electrode will become about 0.1 $\mu$m by adding the width expanded by diffusion of 0.05 $\mu$m to the difference of 0.05 $\mu$m in thickness between the primary side-wall insulating film and the secondary side-wall insulating film. This distance becomes same as or more than 0.09 $\mu$m, which is the depth-wise effective length of the deep impurity diffusion layer 24 (or 25). Thus it becomes clear that this structure will suppress the junction leakage current.

In the second embodiment, assuming that the distance from the end of the silicide layer 32 on the side of the gate electrode to the end of the deep impurity diffusion layer 24 (or 25) on the side of the gate electrode is 0.05 $\mu$, the same as the first embodiment, it is possible to make the depth of the deep impurity diffusion layer more shallow and thus to embody the structure of a more miniaturized transistor.

As described above, according to the second embodiment, it is possible not only to form a shallow and high concentration impurity diffusion layer adjacent to the gate electrode but also to provide a transistor with a suppressed junction leakage current.

In the above-mentioned first and second embodiments, by forming a side-wall insulating film of the gate electrode twice, it becomes possible to change the material of the side wall or the width (thickness) of the side-wall impurity diffusion layer at the first time and second time. This process makes it possible to use a side-wall insulating film with the width suitable for enhancing the performance of a transistor at the first time and to use the side-wall insulating film with the width and material suitable for making a salicide structure which form a silicide film on the gate electrode and the source/drain region.

Also it is possible by forming the side wall of a gate electrode twice to form first an impurity diffusion layer portion not adjacent to the gate electrode in the source/drain region and then to embody the salicide structure which form a silicide film on the gate electrode and the source/drain region after forming later an impurity diffusion layer adjacent to the gate electrode.

Further, $SiO_2$ film 20 previously formed on the side-wall of the gate electrode acts as a protective film for the gate insulating film when the side-wall insulating film is removed. This prevents a damage to the gate insulating film due to the isotropic etching for the side-wall insulating film removal.

Furthermore, it is possible to give a heat treatment necessary for the activation of the impurity in the impurity diffusion layer not adjacent to the gate electrode of a transistor and in the gate electrode at first. Thus it becomes possible to form a shallow impurity diffusion layer adjacent to the gate electrode, resulting in improvement of the short-channel effect which hinders the miniaturization of a transistor and enabling effective embodiment of a more miniaturized transistor.

In the above-mentioned manufacturing method of a MOS device, it is also possible to use the so-called elevated source-drain structure which positions a conductive layer higher than the surface of the substrate when forming a conductive layer on a source-drain diffusion layer after forming a primary or secondary side-wall insulating film. Especially, when an elevated source-drain structure is formed after forming a primary side-wall insulating film, impurities contained in the shallow impurity diffusion layer are effectively prevented from deeply diffusing into the substrate due to a heat treatment for formation of an epitaxial silicon layer. However, the elevated source-drain structure causes problems, such as the formation of facets or cavities near the gate electrode and the occurrence of surface-roughness, necessitating a need to solve these problems. In the following embodiments, examples adopting the elevated source-drain structure will be described.

Prior to the description of the embodiments, the problems encountered in the past will be described. In the elevated source-drain structure, in order to suppress junction leakage current by providing distance between the silicide layer in the source-drain diffusion region and the high concentration diffusion region, a single-crystal epitaxial silicon layer is formed selectively only on the gate electrode and on the diffusion layer.

One example of the elevated source-drain structure is implemented by the formation of a single-crystal growth of the silicon layer using hydrogen, dichlorsilane and hydrogen chloride as source gases by forming a gate side-wall insulating film following the formation of a low concentration diffusion region. Following this process, a MOS device having the elevated source-drain structure is formed by forming a high concentration diffusion region.

The conventional manufacturing process of a MOS device employs largely the following three methods.

The first method is to form an epitaxial silicon layer under the supply limited condition.

The second method is to form an epitaxial silicon layer under the reaction limited condition with high selectivity.

The third method is to use the surface reaction limited condition by attaching importance to the selectivity of an epitaxial silicon layer, forming no facets near the gate electrode by devising a side-wall structure.

The above-mentioned three conventional technology will be described as follows with reference to the drawings.

FIGS. 5A to 5H are views illustrating in steps the manufacturing method of a MOS structure formed by the first method of the conventional process.

Figure 5A:
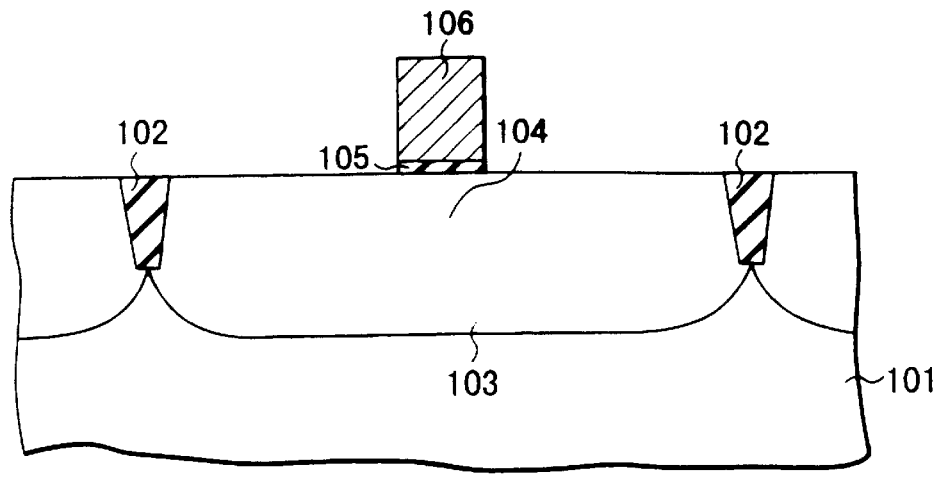
FIGS. 5A to 5H are sectional views illustrating in steps the method of manufacturing a MOS device formed by a first method of the conventional technology.

First, as shown in FIG. 5A, form an element isolation insulating film 102 on a silicon substrate 101 by the buried isolation method. After an oxide film of 2 nm or less has been formed on the surface of silicon, form a well region 103 and a channel-formation region 104 in the active element portion. Following this process, deposit first a gate insulation film 105 formed by the thermal oxidation method or the LPCVD (low pressure chemical vapor deposition) method, followed by the deposition of a polysilicon gate electrode 106 and the gate patterning. Following this process, dry-etch the silicon oxide film 105 and the polysilicon gate electrode 106 by the RIE method to process the gate electrode into a shape of a pillar as shown in FIG. 5A.

Figure 5B:
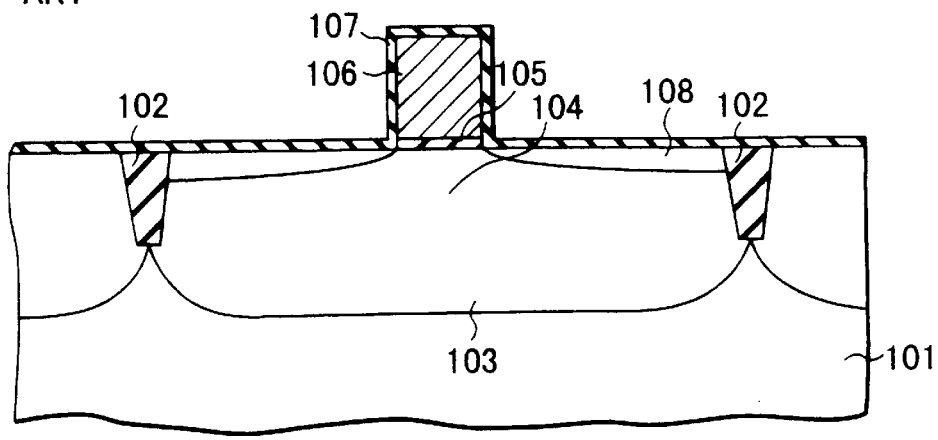

Next, as shown in FIG. 5B, form a low concentration diffusion region 108 by ion-implantation after forming a post-oxide $SiO_2$ film 107 by the thermal oxidation method as post oxidation.

Figure 5C:
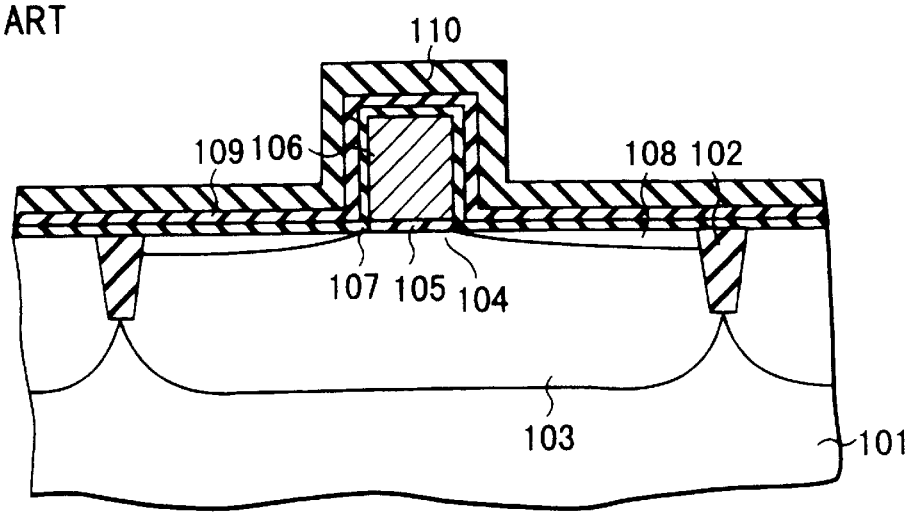
Figure 5D:
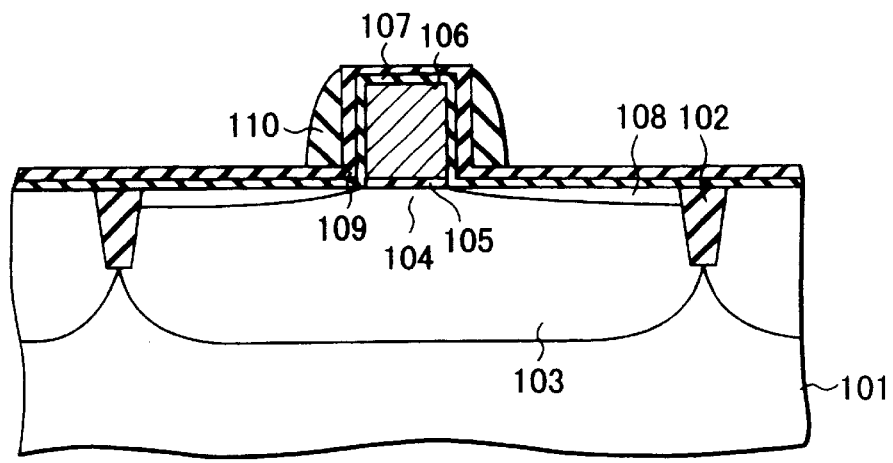
Figure 5E:
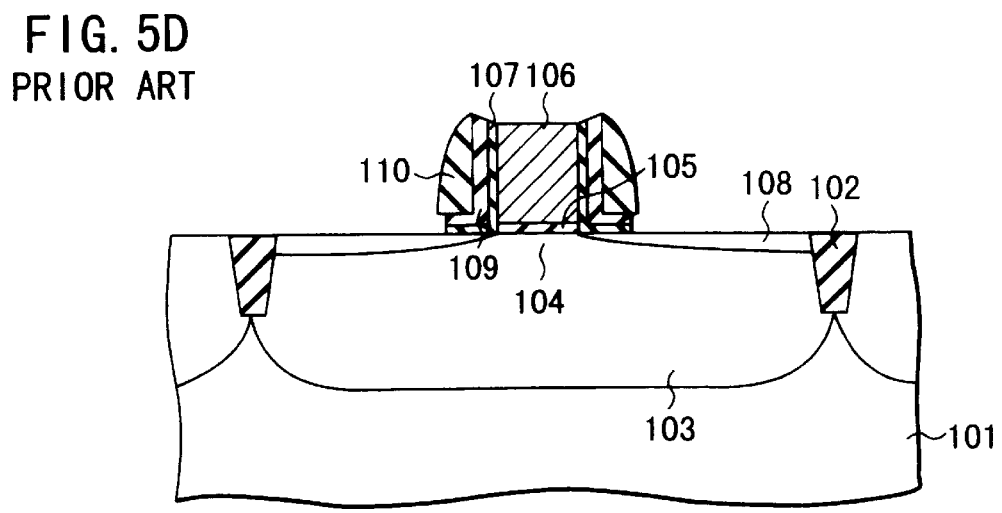
Figure 5F:
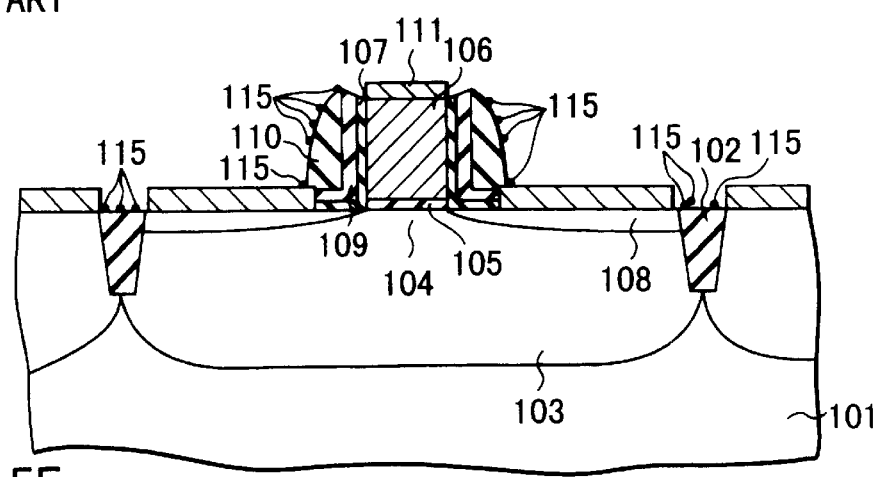

Further, as shown in FIG. 5C, deposit a nitride silicon side-wall film 110 following a $SiO_2$ side-wall film 109 by the LPCVD method. Next, as shown in FIG. 5D, form a side-wall with a nitride silicon side-wall film 110 by reactive ion-etching. Following this process, as shown in FIG. 5E, etch a $SiO_2$ side-wall 109, exposed by dilute hydrofluoric acid, and the post-oxide $SiO_2$ film 107. Further, implement high-temperature processing in hydrogen environment to remove the oxide film completely.

Net, as shown in FIG. 5E, carry out epitaxial silicon growth at a comparatively low temperature of 700° C. or less which is the supply limited condition, in order to form an epitaxial silicon film with a flat surface which does not form facets near the gate electrode. Form a silicon film 111 on the silicon-exposed portion, that is on the gate electrode and on the diffusion layer, by heating the silicon substrate and supplying a reactant gas, such as $SiH_4$, $SiH_2Cl_2$, and $SiHCl_3$, with hydrogen onto the substrate.

Carry out this process under a typical condition with the processing temperature of 700° C., the flow of hydrogen at 15 slm, $SiH_2CL_2$ at 0.4 slm, HCl at 0.1 slm, and processing pressure at 10 Torr. However, as the film is being grown under the supply limited condition, silicon particles 115 are formed on the element isolation insulating film 102 and on the nitride silicon side-wall 109 although the nucleation density is low. This is a failure in the selection of the primary selective growing process. In the past, such gas as $Cl_2$ has been used to remove such silicon particles 115 by flushing. It has caused such problems, as too much time consumed and restrictions on the apparatus to perform the aforementioned flashing operation.

Figure 5G:
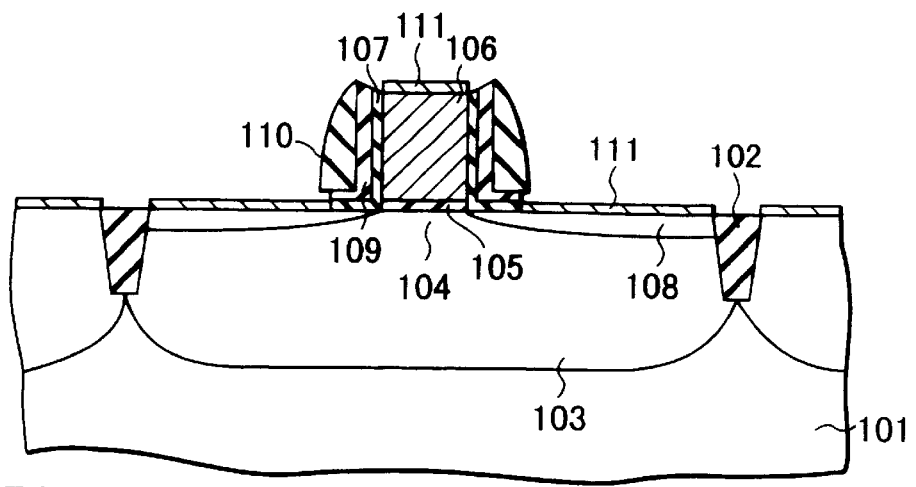
Figure 5H:
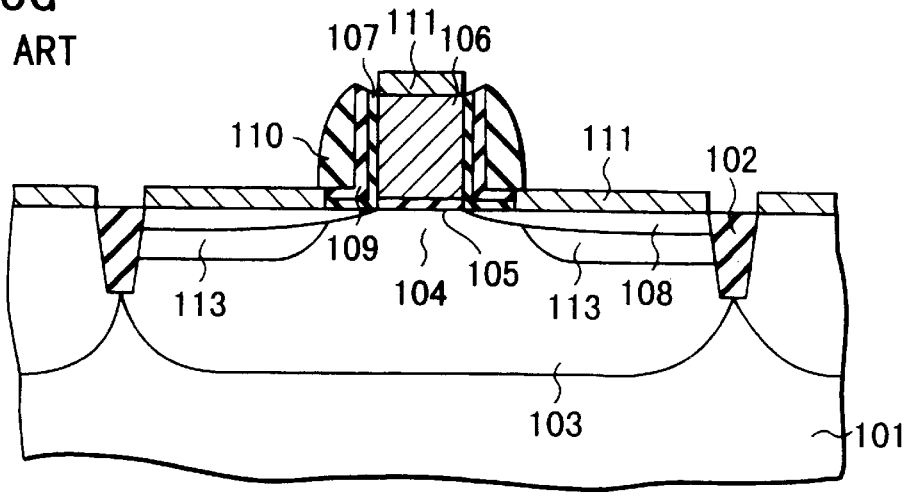

As described above, according to the conventional process, as shown in FIG. 5G, the selectivity of silicon has been secured by the etching of silicon with $Cl_2$ gas on the element isolation insulating film 102 and the nitride silicon side-wall 110. And as shown in FIG. 5H, a silicon layer 111 has been formed selectively on the gate electrode and the diffusion layer by repeating the process of the aforementioned film formation and the etching although it required considerably many processes and much time.

In the conventional first process described above, there remain such problems as selectivity is harmed due to the growth of an epitaxial silicon layer under the supply limited condition. This necessitates the etching of the silicon particles 115 grown unintentionally on the element isolation insulating film or on the nitride silicon side-wall by flushing $Cl_2$ gas after the silicon particles have grown to the size of several millimeters. Following this process, the process of film growth and etching is repeated to grow silicon gradually. Therefore, this process has caused problems, such as restrictions on the apparatus, slow growth speed of the silicon layer, and inappropriateness for mass production.

Figure 6:
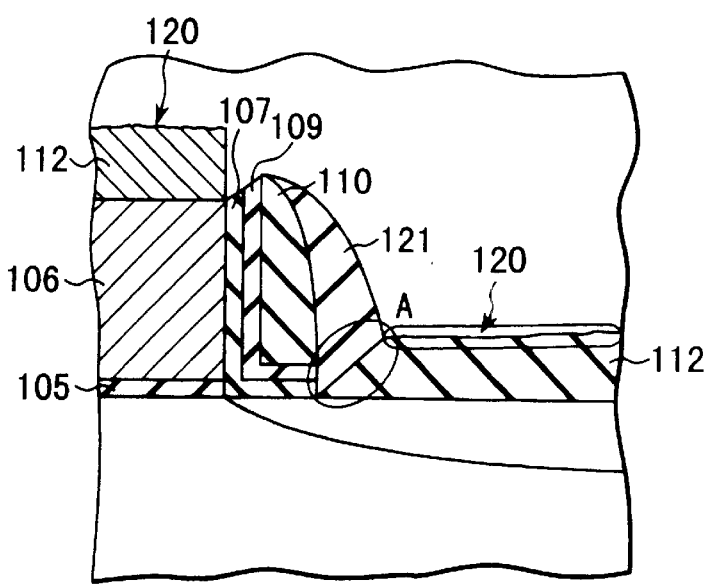
FIG. 6 is a sectional view of a MOS device formed by a second method of the conventional technology.

Next, FIG. 6 is a sectional view of the MOS structure formed by the second method of the conventional process. The second method of the conventional process is to grow film to form the epitaxial silicon layer under the reaction limited condition with high selectivity. This method makes it possible to form an epitaxial silicon layer with good selectivity, but at the same time form facets A near the gate electrode.

FIG. 6 is a sectional view of the MOSFET, the elevated source-drain structure formed when the selective growth of silicon was performed under the reaction limited condition of 800° C. or higher temperature to secure selectivity. The process of the second method requires silicon film 109 to be formed under the reaction limited condition at a high temperature, thus resulting in the formation of facets near the gate electrode although selectivity is secured. If the process is continued with the aforementioned facets left as formed, there arise such problems as the influence of the short-channel effect due to the deepening of the impurity profile near the gate electrode or the increase in the junction leakage current near the gate electrode when silicidation is performed on the upper side of the source-drain layer.

Then it becomes necessary anew to form a secondary $SiO_2$ side-wall film 121 to cover the facet A. However, the process becomes complicated because one additional process for the formation of a side-wall is required. Also one more additional thermal process (700 to 800° C.) for the formation of a side-wall is required, causing the diffusion layer to be diffused by the heat due to the two thermal processes. This caused problems that it is difficult to form a shallow junction and also that it is not possible to design a desired device.

Furthermore, the reaction limited condition creates a process sensitive to the surface, deteriorating crystallinity by depending on the crystallinity of primarily formed silicon of the epitaxial silicon layer. For example, as shown by 120 in FIG. 6, the formation of a film on the surface implanted with high-concentration ion (particularly on polysilicon) causes a problem that the surface roughness is deteriorated.

Figure 7:
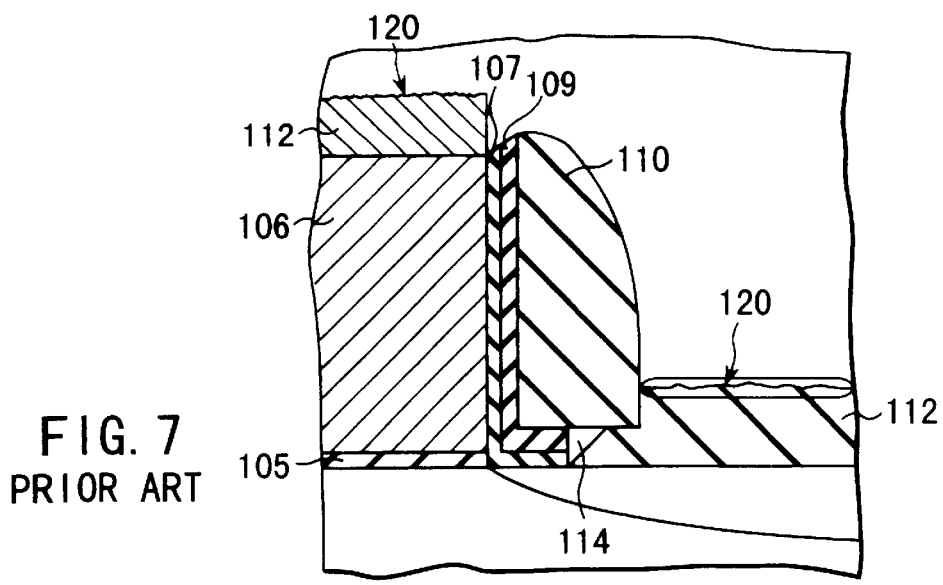
FIG. 7 is a sectional view of a MOS device formed by a third method of the conventional technology.
Figure 8:
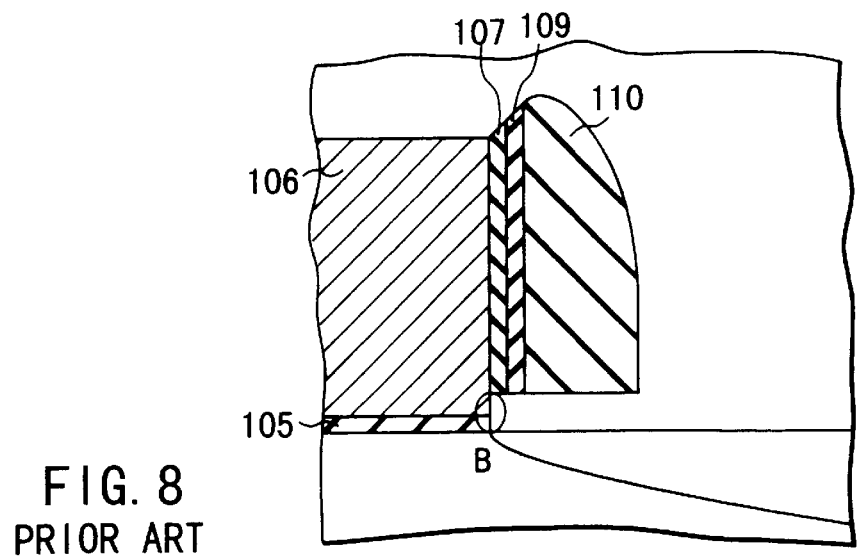
FIG. 8 is another sectional view of a MOS device formed by a third method of the conventional technology.
Figure 9:
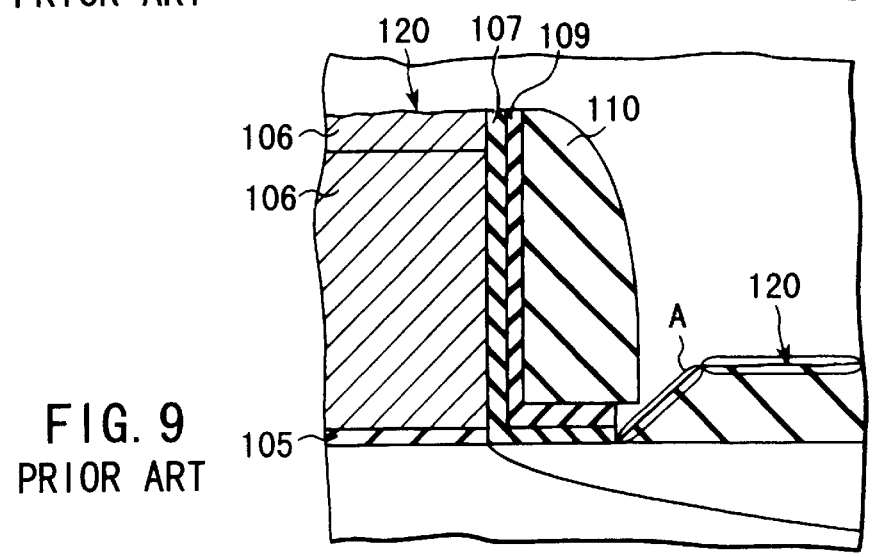
FIG. 9 is still another sectional view of a MOS device formed by a third method of the conventional technology.

FIGS. 7 to 9 are views roughly illustrating the MOS structure formed by the third method of the conventional process. The third method of the conventional process uses the surface reaction limited condition by attaching importance to the selectivity of the epitaxial silicon layer, but it is the method to avoid forming facets near the gate electrode by devising the side-wall structure.

As shown in FIG. 7, silicon epitaxial growth in the elevated source-drain structure MOSFET is formed under a high temperature of the reaction limited condition. Here is the utilization of the wettability to the epitaxial silicon film which is higher toward a nitride silicon side-wall film 110 compared with a $SiO_2$ side-wall film 109. In other words, this utilizes the characteristics of the grown silicon layer which grows facets toward the $SiO_2$ side-wall film but which does not grow facets toward the nitride silicon side-wall film 110.

In concrete terms, process beforehand the post-oxide $SiO_2$ film 107 and the $SiO_2$ side-wall film 109 underneath the nitride silicon side-wall film 110 with side-etching operation so that while silicon will make epitaxial growth up to the nitride silicon side-wall portion, the facet portion will go into the side-etching portion completely. This process makes it possible to form an epitaxial silicon layer without forming facets exposed near the gate electrode.

However, this method requires the amount of side-etching to be well controlled, thus causing a difficulty by narrowing processing margin in removing $SiO_2$ with dilute hydrofluoric acid. For example, as shown in B of FIG. 8, when the above-mentioned side-etching was done to a deep depth, a short circuit was created between the gate electrode and the source/drain region, disturbing the formation of a device at times. There was also a problem that the surface roughness 120 was caused by the high-temperature processing as mentioned before. Also, as shown in FIG. 9, when the amount of the aforementioned side-etching processing is small, facet A is formed, narrowing process margin and reducing manufacturing efficiency. Also in the final shape formed, as shown in FIG. 7, there is also a problem that a cavity 114 remains underneath the nitride siliconside-wall 110. In addition, there was a problem that the surface roughness 120 was created by high-temperature processing. As described above, the conventional third process made side-etching processing difficult, and was not suitable for mass production.

The embodiments of the present invention, which will solve the above-mentioned problems, will be described below. It should be noted in the following third to five embodiments that the main theme being the formation of a conductive layer on the source-drain diffusion layer after the formation of a side-wall insulating film, the formation of a side-wall insulating film is performed only once, and that the conventional manufacturing method of the source-drain diffusion layer is adopted as the method to form a source-drain diffusion layer. However, it is possible to combine this method with the method to form a side-wall insulating film twice as described in the first and second embodiments of the present invention.

(Third Embodiment)

FIGS. 10A to 10G are sectional views illustrating in steps the manufacturing process of a MOS transistor of the elevated source-drain structure according to the third embodiment of the present invention.

Figure 10A:
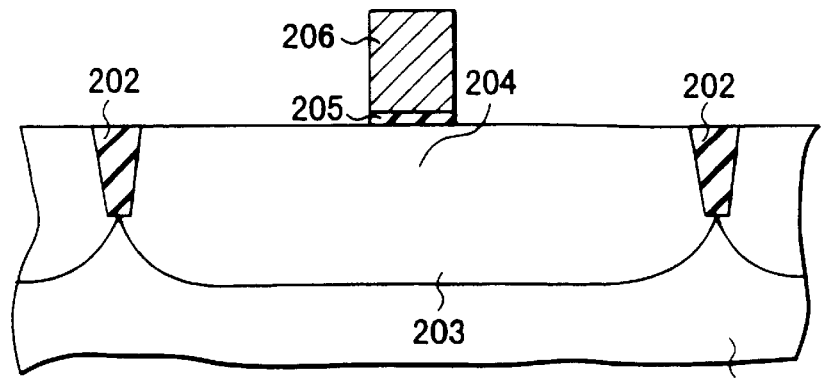
FIGS. 10A to 10G are sectional views illustrating in steps the method of manufacturing a MOS device according to a third embodiment of the present invention.

In the beginning, as shown in FIG. 10A, form by the buried isolation method an element isolation insulating film 202 with the depth of 30 nm on a p-type silicon substrate or a n-type silicon substrate. Next, form a well region 203 and a channel-formation region 204 after an oxide film with a depth of 20 nm or less has been formed on the surface of silicon in the active element portion. The typical condition for ion-implantation, when forming a n-type well region on a p-type silicon substrate, requires phosphorus with the acceleration energy of 500 keV and the dose of $3.0 \times 10^{13}$ $cm^{-2}$ and, when forming its channel-formation region, boron with the acceleration energy of 50 keV and the dose of $1.5 \times 10^{13}$ $cm^{-2}$, and when forming a p-type well region on a n-type silicon substrate, phosphorus with the acceleration energy of 130 keV and the dose of $1.5 \times 10^{13}$ $cm^{-2}$.

Following this process, a polysilicon gate electrode 206 with the thickness of from 10 nm to 20 nm is deposited through a gate insulating film 205 with the thickness of from 1.5 to 0.6 nm which has been formed by the thermal oxidation method or the LPCVD method. In this case the gate electrode may be composed of not only $SiO_2$ but also SiON or SiN or even the high dielectric film $Ta_2O_5$. Or in place of the polysilicon electrode, a metal gate structure using W with TiN, or WN as a barrier metal may be used.

Following this process, process the gate electrode into the shape of a pillar by etching the silicon oxide film 5 and the polysilicon electrode 6 by the RIE method after carrying out gate patterning of 50 nm to 150 nm by the optical lithography method, x-ray lithography method, or electron beam lithography.

Figure 10B:
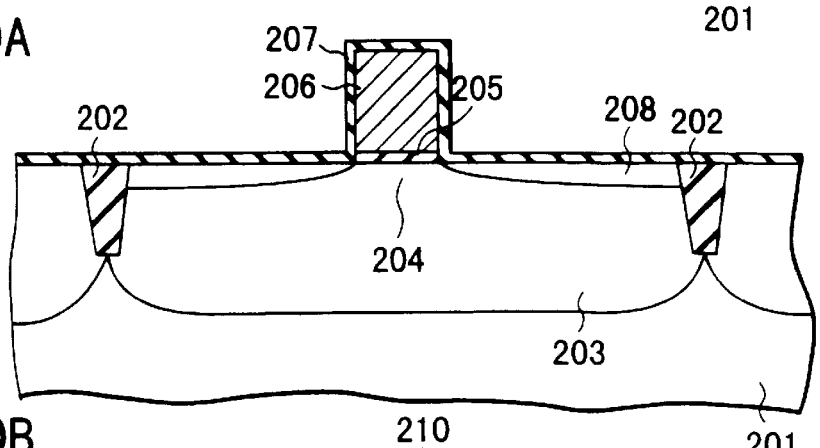

Next, as shown in FIG. 10B, form a low-concentration diffusion region 208 after forming a post-oxide $SiO_2$ film 207 with the depth of 0.4 nm by the thermal oxidation method as post oxidation. The condition for ion-implantation in this case is As with the acceleration energy of 15 keV and the dose of $5.0 \times 10^{14}$ $cm^{-2}$ in the low-concentration n-type diffusion region and $BF_2$ with the acceleration energy of 10 kev and the dose of $5.0 \times 10^{14}$ $cm^{-2}$ in the low-concentration p-type diffusion region.

Figure 10C:
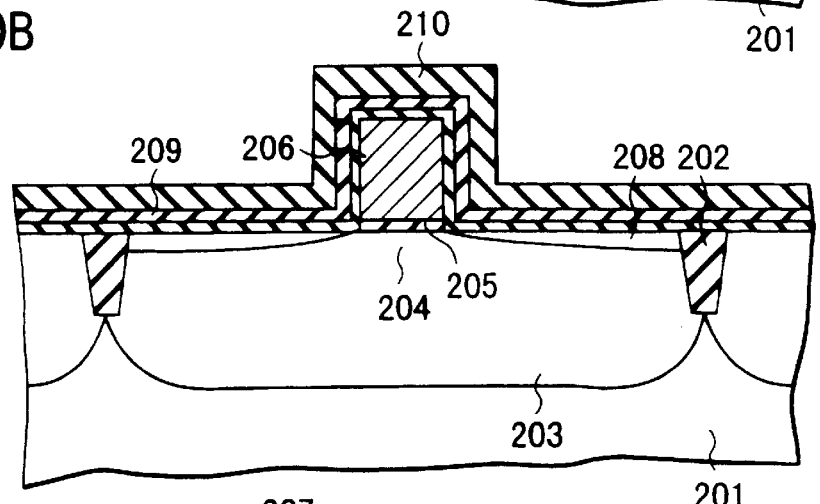

Subsequent to this process, as shown in FIG. 10C, although a nitride silicon side-wall film 210 is deposited following a $SiO_2$ side-wall film 209 by the LPCVD method, deposit at this point the $SiO_2$ side-wall film 209 and the nitride silicon side-wall film 210 with the respective thicknesses of 10 nm and 50 nm, according to the design of a MOS device.

Figure 10D:
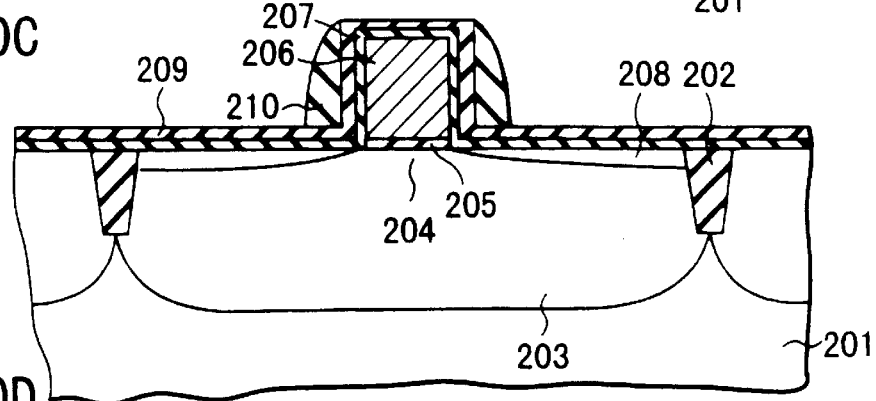

Next, as shown in FIG. 10D, a side wall is formed by the nitride silicon side-wall film 210 by carrying out reactive ion-etching, such as RIE for example.

Figure 10E:
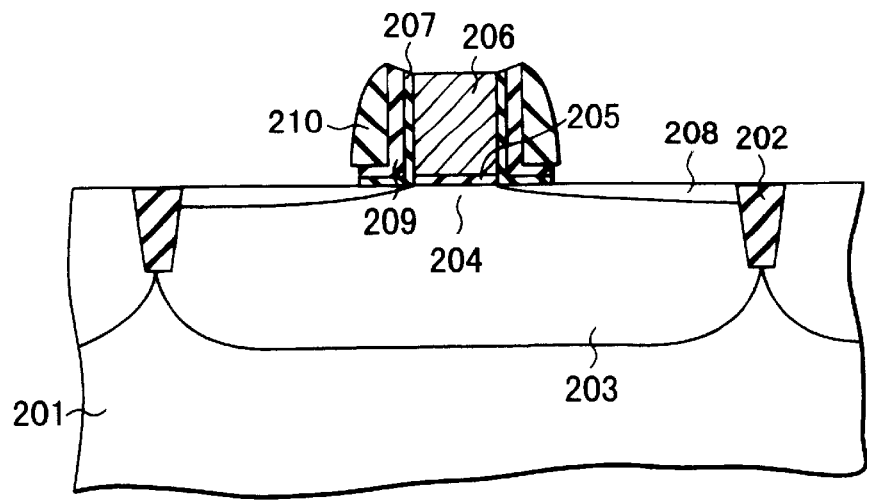

Furthermore, as shown in FIG. 10E, conduct a high-temperature heat treatment to remove the oxide film completely after etching the $SiO_2$ side-wall film 209 and post-oxide $SiO_2$ 207 which have been exposed by, for example, dilute hydrofluoric acid. The condition of treatment in this case is to heat the silicon substrate at 850° C. with the hydrogen flow of 15 slm and the treatment pressure of 160 Torr.

Figure 10F:
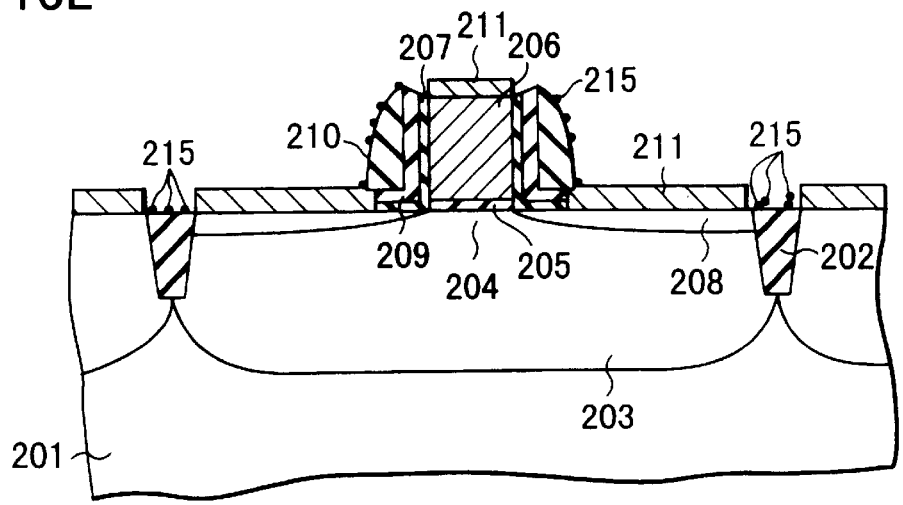

Subsequent to this process, as shown in FIG. 10F, continue to conduct selective epitaxial growth of single-crystal silicon at a comparatively low temperature of 700° C. or lower which becomes the supply limited condition (First SEG). And form a silicon film 111 on the exposed portion of silicon, that is on the gate electrode 206 and on the diffusion layer 208 by supplying a reactant gas, such as $SiH_4$, $SiH_2CL_2$, $SiHCl_3$, with hydrogen onto the grown substrate under the heated condition of the silicon substrate 201.

Under the aforementioned condition, facets are not formed near the gate electrode because of the low temperature. Form this epitaxial silicon film with the thickness of 14 nm or more. The condition at this point is as follows; treatment temperature at 700° C.; hydrogen flow of 15 slm; 0.4 slm of $SiH_2Cl_2$; 0.1 slm of HCl; and treatment pressure at 10 Torr. By forming a silicon film with the thickness of 14 nm in the first SEG, the epitaxial silicon layer 211 under the supply limited condition will reach the nitride silicon side wall 210. However, as shown in 10F, because the film has been grown under the supply limited condition, silicon particles 215 are formed on the element isolation insulating film 202 and on the nitride silicon side wall 210 despite the low nucleation density.

Figure 10G:
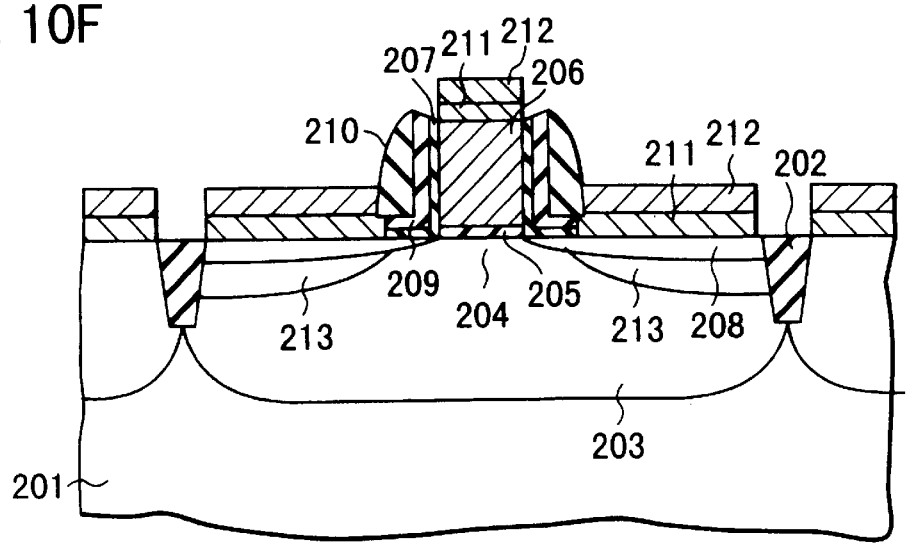

Furthermore, as shown in FIG. 10G, conduct selective epitaxial growth of silicon (Second SEG) under the high temperature of 800° C. or higher which creates the reaction limited condition. In the second SEG, the epitaxial silicon film 212 under the reaction limited condition is grown with high selectivity only on the portion with exposed silicon, that is on the gate electrode 206 and on the diffusion layer 208. Under the reaction limited condition, simultaneous etching reaction is taking place. Therefore, with the initial silicon growth, silicon particles 215 formed on the element isolation insulating film 202 and the nitride silicon side wall 210 are etched.

Also, as shown in FIG. 10G, although placed under the reaction limited condition, the side wall is a nitride silicon film with high wettability to silicon. Therefore, it is possible to form an epitaxial silicon film on which facets are not formed near the gate electrode.

Finally, a high concentration diffusion region 213 is formed by high-concentration ion-implantation. The condition of ion-implantation in this case for the high-concentration n-type diffusion region and the high-concentration p-type diffusion region is As with the acceleration energy of 50 kev and the dose of $7.0 \times 10^{15}$ $cm^{-2}$ in the high-concentration n-type diffusion region, and boron with the acceleration energy of 7 kev and the dose of $4.0 \times 10^{15}$ $cm^{-2}$ in the high-concentration p-type diffusion region. It is also possible to form this high-concentration diffusion region 213 before the growth of silicon.

It should be noted that the epitaxial growth device applied to the growth of silicon is classified, depending on the shape of the reaction chamber, into a vertical type, barrel type, and cluster type, and depending on the heating system, into a resistance heating system, high-frequency heating system, and lamp heating system, and depending on the wafer treatment system, into a single wafer processing system and batch processing system. This processing is possible with any one of these systems.

Also, the present invention can be a system combined with a salicide process. As far as silicide is concerned, suicides of all kinds of metals (Ti, Co, Ni, etc.) can be the object of this process. Also a polymetal structure may be used by forming W on the polysilicon electrode with TiN or WN as a barrier metal.

As described above, in the third embodiment, because the initial growth is performed under the supply limited condition, which is changed to the reaction limited condition after the film has reached the side-wall nitride film, facets are not formed near the gate electrode. In addition, because the initial growth is conducted under the supply limited condition, it is possible to obtain a flat film, which does not depend on the crystallinity of underlying silicon. Also, a cavity will not be formed underneath the nitride silicon side-wall 210.

(Fourth Embodiment)

FIGS. 11A to 11D are sectional views illustrating in steps the manufacturing method of a MOS transistor according to the fourth embodiment of the present invention. The processes of FIGS. 10A to 10E in the third embodiment will be run the same way in the fourth embodiment. After the process of FIG. 10E is finished, implement epitaxial growth of single-crystal silicon (the first SEG) at a comparatively low temperature of 700° C. or lower which makes the supply limited condition. This process forms a silicon film 211 on the silicon-exposed portion, that is on the gate electrode 206 and on the diffusion layer 208. Processed under the low-temperature condition, this does not cause surface roughness. Under this condition facets are not formed near the gate electrode. A epitaxial silicon film is formed with the thickness of 14 nm or more at this point.

Figure 11A:
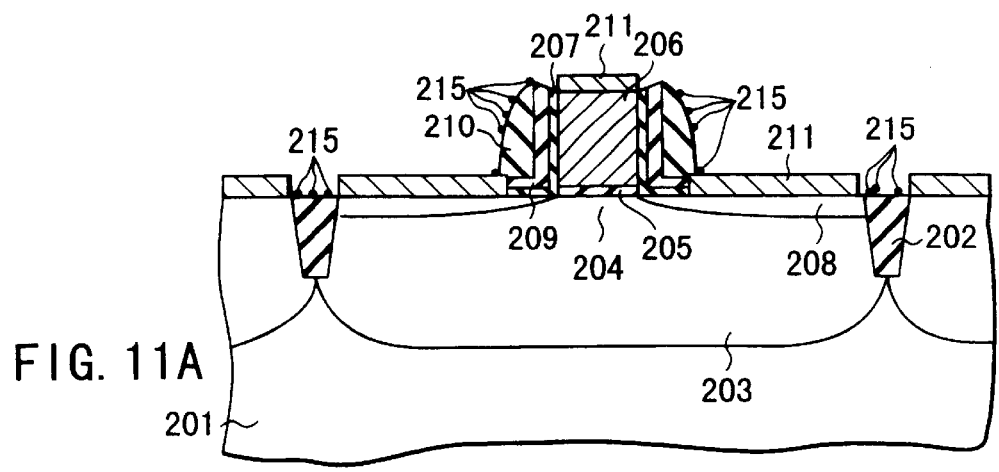
FIGS. 11A to 11C are sectional views illustrating in steps the method of manufacturing a MOS device according to a fourth embodiment of the present invention.

The condition at this point is the treatment temperature at 700° C., hydrogen flow of 15 slm, 0.4 slm of $SiH_2Cl_2$, 0.1 slm of HCl, and the processing pressure at 10 Torr. By forming a 14 nm thick silicon film according to the first SEG, epitaxial silicon film 211 grown under the supply limited condition reaches the nitride silicon side-wall 210. However, as shown in FIG. 11A, because the film was grown under the supply limited condition, silicon particles 215 are formed on the element isolation insulating film 202 and on the nitride silicon side-wall 210 although the nucleation density is low.

Figure 11B:
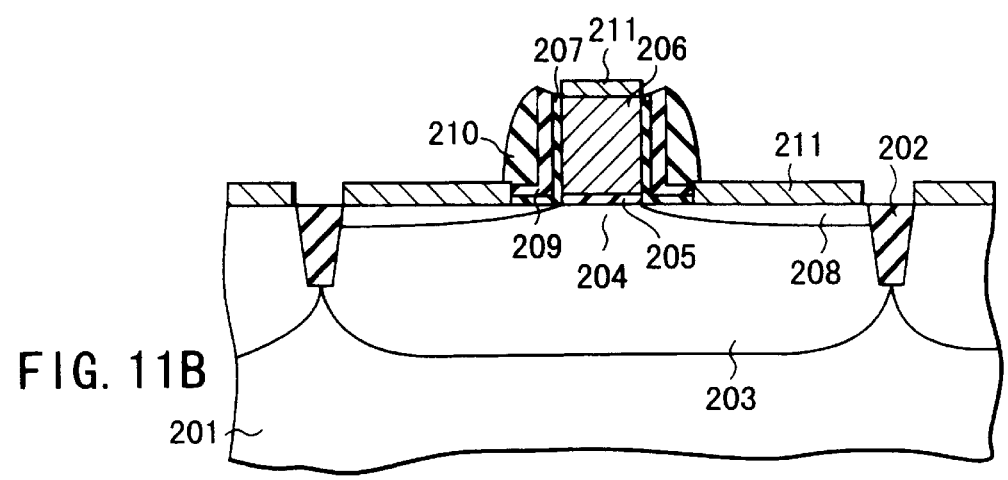

Next, as shown in FIG. 11B, flush only $Cl_2$ gas to etch silicon particles 215 formed on the embedded element isolation insulating film 202 and on the nitride silicon side-wall 209 to secure the selectivity of silicon.

Figure 11C:
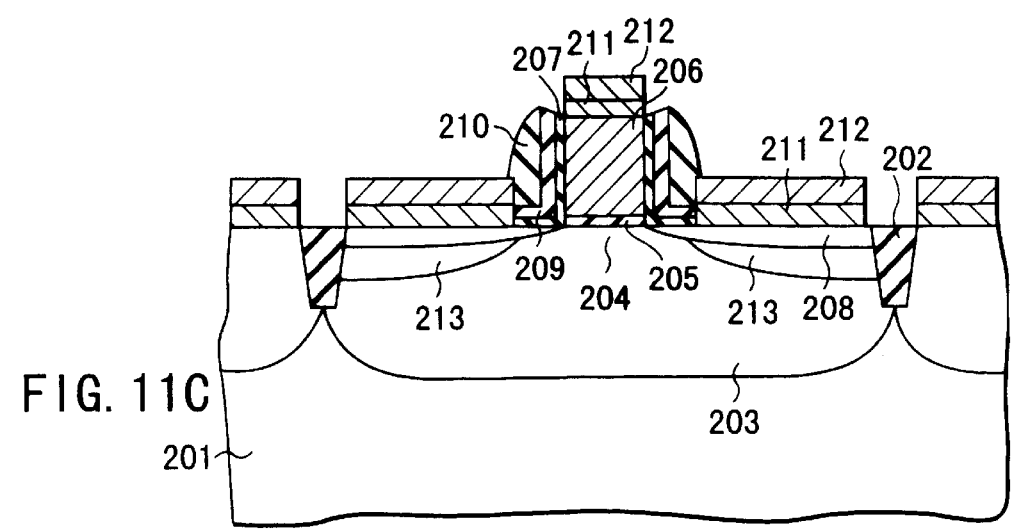

Furthermore, as shown in FIG. 11C, perform selective epitaxial growth of silicon (the second SEG) under the reaction limited condition of a high temperature at 800° C. or higher. The typical condition at this point is the treatment temperature at 800° C., hydrogen flow of 15 slm, 0.4 slm of $SiH_2Cl_2$, 0.1 slm of HCl, and treatment pressure at 10 Torr. According to the second SEG, the silicon film 212 grown under the reaction limited condition is formed with good selectivity on the silicon-exposed portion, that is only on the gate electrode and on the diffusion layer. Despite the reaction limited condition, the side-wall is a nitride silicon film with high wettability to silicon, and it is therefore possible to form an epitaxial silicon film which does not allow facets to form near the gate electrode.

Finally, high-concentration ion-implantation forms a high concentration diffusion region 213. The condition of ion-implantation in the high-concentration n-type diffusion area and the high-concentration p-type diffusion region at this point is As implanted at the acceleration energy of 50 keV with the dose of $7.0 \times 10^{15}$ cm$^{-2}$ in the high-concentration n-type diffusion region, and boron implanted at the acceleration energy of 7 keV and the dose of $4.0 \times 10^{15}$ cm$^{-2}$ in the high-concentration p-type diffusion region. It is also possible to form the high-concentration diffusion area 213 before the growth of silicon, or to combine it with the salicide process. As described above, by using the fourth embodiment of the present invention, it is possible to secure the selectivity of silicon epitaxial growth by performing the initial growth under the supply limited condition and etching with $Cl_2$ gas silicon particles formed unintentionally on the element isolation diffusion film and on the side-wall after the film has reached the side-wall nitride film. It is also possible to realize the structure which does not allow facets to form near the gate electrode by switching to the reaction limited condition in the second SEG after the film has reached the side-wall nitride film in the first SEG.

Furthermore, because the initial process of silicon growth is performed under the supply limited condition, it is possible to obtain a flat film which does not depend on the crystallinity of underlying silicon. Also there will not arise such a problem that a cavity is formed underneath the nitride silicon side-wall 210.

(The Fifth Embodiment)

Figure 12A:
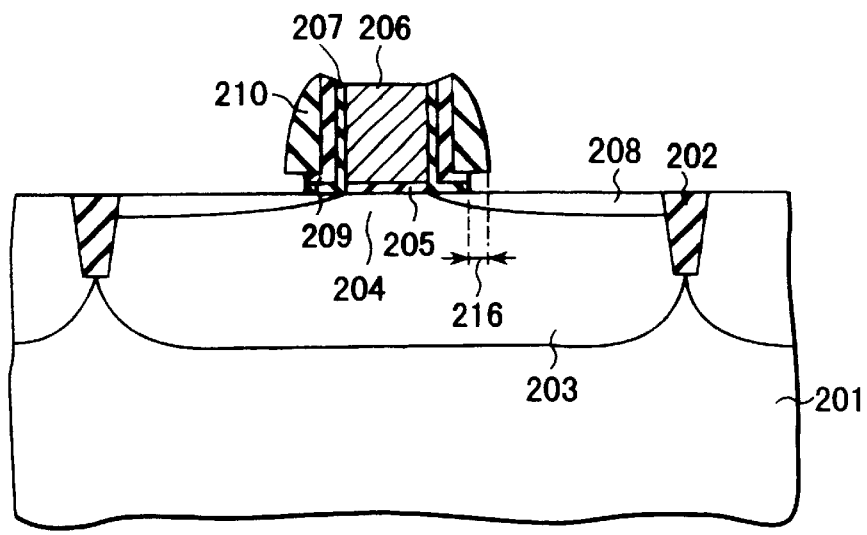
FIGS. 12A to 12C are sectional views illustrating in steps the method of manufacturing a MOS device according to a fifth embodiment of the present invention.
Figure 12B:
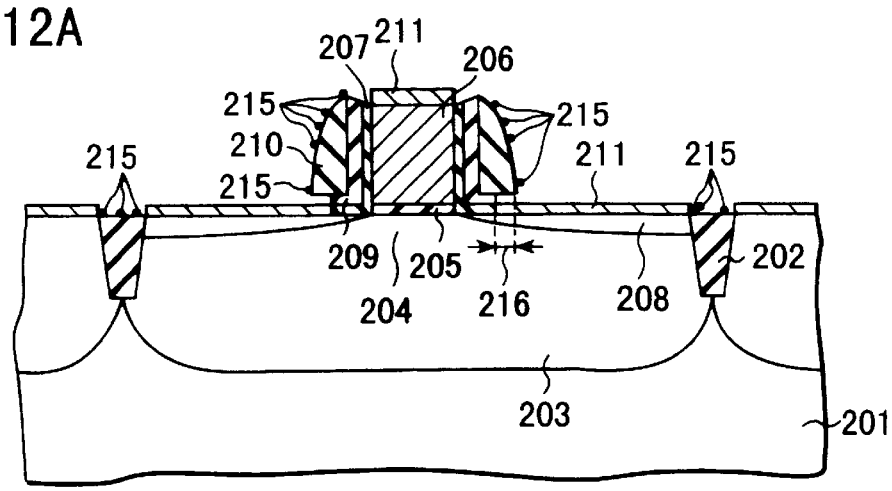
Figure 12C:
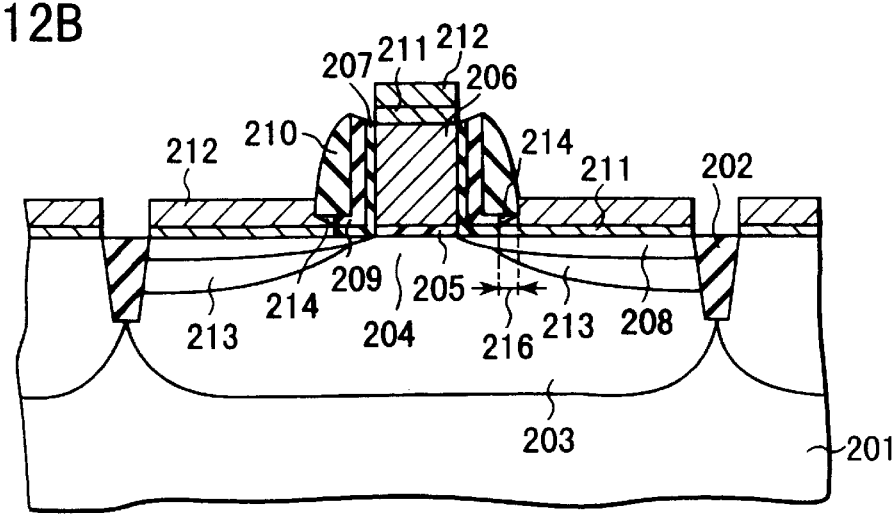

FIGS. 12A to 12C are sectional views illustrating in steps the manufacturing process of a MOS transistor according to the fifth embodiment of the present invention. The processes of FIGS. 10A to 10E in the third embodiment are implemented in the same way also in the fifth embodiment. As shown in FIG. 12A, the subsequent process performs etching with such as dilute hydrofluoric acid the post-oxide film 207 and the $SiO_2$ side-wall film 209 which have been exposed as the pretreatment of silicon epitaxial growth. At this point it is so arranged that a side-etching 216 with the depth of 15 nm will go underneath the nitride silicon side-wall 205.

Following this process, as shown in FIG. 12B, a silicon film 211 is formed on the silicon-exposed portion, that is on the gate electrode and on the diffusion layer, by performing the growth of single-crystal silicon under the supply limited condition of 700° C. or lower. At this point, deposit an epitaxial silicon film with the thickness of about 7 nm for example. Because this epitaxial silicon film is formed under the supply limited condition, facets are not formed. The condition at this point is the treatment temperature at 700° C., hydrogen flow of 15 slm, 0.4 slm of $SiH_2Cl_2$, 0.1 slm of HCl and the processing pressure at 10 Torr.

However, as shown in FIG. 12B, because the film was grown under the low temperature of the supply limited condition, silicon particles 215 are formed on the element isolation insulating film 202 and on the nitride silicon side-wall 210 although the nucleation concentration is low.

Furthermore, perform epitaxial growth of silicon under the high temperature of 800° C. or higher which makes the reaction limited condition. The condition at this point is the treatment temperature at 800° C., hydrogen flow of 15 slm, 0.4 slm of $SiH_2Cl_2$, 0.1 slm of HCl, and the processing pressure at 10 Torr. Under the reaction limited condition, a silicon film 212 is formed with good selectivity only on the silicon-exposed portion, that is on the gate electrode and on the diffusion layer 208. Because etching reaction is also taking place at the same time, the silicon particles 215, which were formed on the element isolation insulating film 202 and on the nitride silicon side-wall 210 during the initial stage of silicon growth, are also etched.

Following this process, as shown in FIG. 12C, although facets 214 are formed during the growth of silicon under the reaction limited condition, it becomes possible to grow a film without forming facets near the gate electrode by inserting the facet portions into the side-etching region 216 completely. In the fifth embodiment of the present invention, it is possible, by forming a silicon layer with the thickness of 7 nm under the supply limited condition in the initial stage, to reduce the amount of side-etching to be inserted under the nitride silicon side-wall 210 and make the processing margin wider than the third process of the conventional method.

Finally, a high-concentration diffusion region 213 is formed by high-concentration ion-implantation. The typical condition for ion-implantation in the high-concentration n-type diffusion region and the high-concentration p-type diffusion region at this point is As with the acceleration energy of 50 kev and the dose of $7.0 \times 10^{15}$ cm$^{-2}$ in the high-concentration n-type diffusion region, and boron with the acceleration energy of 7 keV and the dose of $4.0 \times 10^{15}$ cm$^{-2}$ in the high-concentration p-type diffusion region. It is also possible to form this high-concentration diffusion region 213 before the growth of silicon. Etching by flushing only $Cl_2$ gas may also be applied to the silicon particles 215 which were formed unintentionally on the element isolation diffusion film 202 and on the nitride silicon side-wall 210 by the initial growth of film under the supply limited condition. It is also possible that the film grown in the initial stage is less than 14 nm thick and that the film may be grown according to the design.

As described above, in the fifth embodiment, the initial growth of the film is performed up to the extent that it does not reach the side-wall nitride film. under the supply limited condition, by inserting a proper amount of side-etching into the oxide film underneath the side-wall nitride film before selective epitaxial growth takes place. By this process, the amount of side-etching to be inserted underneath the nitride silicon side-wall can be kept small, thus making it possible to widen margin for the dilute hydrofluoric acid treatment which is the pretreatment of the epitaxial growth.

Also in the elevated source-drain structure process, it is possible to form by a comparatively simple process the silicon film which does not depend on underlying silicon without forming facets near the gate electrode, by combining the supply limited condition and the reaction limited condition in the selective growth process of silicon which has been performed only either under the supply limited condition or under the reaction limited condition in the past. Furthermore, it is also possible to keep a cavity small enough underneath the nitride silicon side-wall.

Although a MOS-type transistor was used as an example in describing the foregoing embodiments, it is possible to apply the present invention to a MIS (Metal Insulator Semiconductor)-type transistor which uses various insulating films not limited to $SiO_2$.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising the steps of:

forming a gate electrode on a semiconductor substrate through a gate insulating film;

forming a protective insulating film on a sidewall of the gate electrode;

forming a first side-wall insulating film on the protective insulating film formed on the side-wall of the gate electrode;

forming a first impurity diffusion layer on a surface of the semiconductor substrate by using the gate electrode and the first side-wall insulating film as a mask;

removing the first side-wall insulating film after the step of forming the first impurity diffusion layer;

forming a second impurity diffusion layer on the surface of the semiconductor substrate by using the gate electrode and the protective insulating film as a mask after the step of removing the first side-wall insulating film;

forming a second side-wall insulating film on the protective insulating film formed on the side-wall of the gate electrode after the step of forming the second impurity diffusion layer; and forming a conductive film on an upper surface of the gate electrode and on a surface of the second impurity diffusion layer by using the second side-wall insulating film as a mask.

2. The method according to claim 1, wherein the step of forming the conductive film includes the step of forming a conductive film having a resistance lower than that of the second impurity diffusion layer.

3. The method according to claim 1, wherein a thickness of the first side-wall insulating film differs from that of the second side-wall insulating film.

4. The method according to claim 1, wherein a thickness of the first side-wall insulating film is smaller than that of the second side-wall insulating film.

5. The method according to claim 1, wherein the material of the first side-wall insulating film differs from that of the second side-wall insulating film.

6. The method according to claim 1, wherein the material of the first side-wall insulating film is $SiO_2$ and the second side-wall insulating film is composed of SiN.

7. The method according to claim 1, wherein the step of forming the first impurity diffusion layer and the step of forming the second impurity diffusion layer include the step of introducing and activating an impurity and a temperature of a heat treatment for activating the impurity of the first impurity diffusion layer is higher than that of the second impurity diffusion layer.

8. The method according to claim 1, wherein a diffusion distance of an impurity of the first impurity diffusion layer is longer than that of an impurity of the second impurity diffusion layer.

9. The method according to claim 1, wherein the step of forming the second side-wall insulating film includes forming a silicon oxide film and a silicon nitride film laminated thereon, the step of forming a conductive film on an upper surface of the gate electrode and on a surface of the second impurity diffusion layer includes performing selective growth of silicon under a supply limited condition, and performing selective growth of silicon under a reaction limited condition, after performing selective growth of silicon under a supply limited condition.

10. The method according to claim 9, further comprising etching back the silicon oxide film underneath the silicon nitride film, before the step of forming a conductive film on an upper surface of the gate electrode and on a surface of the second impurity diffusion layer.

11. The method according to claim 9, wherein performing selective growth of silicon under a supply limited condition includes performing the selective growth up to an extent where the silicon-growing film becomes thicker than a thickness of the silicon oxide film underneath the nitride film.

12. The method according to claim 9, further comprising removing by etching silicon particles formed on the semiconductor substrate including the side-wall insulating film, after performing selective growth of silicon under the supply limited condition.

13. The method according to claim 1, wherein the step of forming the first side-wall insulating film includes forming a silicon oxide film and a silicon nitride film laminated there on, the step of forming a conductive film on an upper surface of the gate electrode and on a surface of the first impurity diffusion layer includes performing selective growth of silicon under a supply limited condition, and performing selective growth of silicon under a reaction limited condition, after performing selective growth of silicon under a supply limited condition.

14. The method according claim 13, further comprising etching back the silicon oxide film underneath the silicon nitride film, before the step of forming a conductive film on an upper surface of the gate electrode and on a surface of the first impurity diffusion layer.

15. The method according to claim 1, wherein the gate electrode is formed of polycrystal silicon and the step of forming a first impurity diffusion layer includes performing simultaneously introduction of impurity into the gate electrode and activation of the impurity.

16. The method according to claim 1, wherein the semiconductor substrate is composed of silicon and the conductive film is formed of a refractory metal and silicon as main materials.

* * * * *